(12) United States Patent
Brands et al.

(10) Patent No.: US 11,391,851 B2
(45) Date of Patent: Jul. 19, 2022

(54) SEALED RADIATION DETECTOR MODULE SYSTEMS AND METHODS

(71) Applicant: FLIR Detection, Inc., Stillwater, OK (US)

(72) Inventors: Hartmut Brands, Oak Ridge, TN (US); Stephen W. Fleetwood, Knoxville, TN (US); Leslie D. Hoy, Knoxville, TN (US); Jason K. Smith, Oak Ridge, TN (US); Felix J. Liang, Oak Ridge, TN (US); Matthew D. Waggoner, Knoxville, TN (US); Kyle Hawes, Knoxville, TN (US); Jeffrey Robert Preston, Knoxville, TN (US); Jeffrey A. Verity, Knoxville, TN (US)

(73) Assignee: Teledyne FLIR Detection, Inc., Stillwater, OK (US)

( * ) Notice: Subject to any disclaimer, the term of this patent is extended or adjusted under 35 U.S.C. 154(b) by 0 days.

(21) Appl. No.: 17/019,000

(22) Filed: Sep. 11, 2020

(65) Prior Publication Data

US 2021/0096270 A1    Apr. 1, 2021

Related U.S. Application Data

(63) Continuation-in-part of application No. 15/953,105, filed on Apr. 13, 2018, now Pat. No. 10,782,422,
(Continued)

(51) Int. Cl.
*G01T 1/16* (2006.01)
*G01T 1/17* (2006.01)
(Continued)

(52) U.S. Cl.
CPC ............ *G01T 1/1603* (2013.01); *G01T 1/02* (2013.01); *G01T 1/023* (2013.01); *G01T 1/026* (2013.01);
(Continued)

(58) Field of Classification Search
CPC ......... G01T 1/1603; G01T 1/02; G01T 1/023; G01T 1/026; G01T 1/171; G01T 1/175;
(Continued)

(56) References Cited

U.S. PATENT DOCUMENTS

| | | |
|---|---|---|
| 3,646,347 A | 2/1972 | Farmer |
| 4,383,175 A | 5/1983 | Toepke |

(Continued)

FOREIGN PATENT DOCUMENTS

| | | |
|---|---|---|
| EP | 0402035 A1 | 12/1990 |
| EP | 3026463 | 6/2016 |

(Continued)

OTHER PUBLICATIONS

Nakanishi et al.—JP 2009-277910 A—Google Patents English Translation obtained Oct. 7, 2021 (Year: 2021).*

*Primary Examiner* — David P Porta
*Assistant Examiner* — Jeremy S Valentiner
(74) *Attorney, Agent, or Firm* — Haynes and Boone, LLP

(57) ABSTRACT

Techniques are disclosed for systems and methods to provide a radiation detector module for a radiation detector. A radiation detector module includes a metallic and/or metalized enclosure, a radiation sensor disposed within the enclosure, readout electronics configured to provide radiation detection event signals corresponding to incident ionizing radiation in the radiation sensor, and a cap including an internal interface configured to couple to the readout electronics and an external interface configured to couple to a radiation detector, where the cap is configured to hermetically seal the radiation sensor within the enclosure. The cap may be implemented as an edge plated printed circuit board (PCB) including a slot configured to mate with a planar edge of an open surface of the enclosure, where the slot is
(Continued)

soldered to the planar edge of the enclosure to hermetically seal the radiation sensor within the enclosure.

20 Claims, 14 Drawing Sheets

Related U.S. Application Data which is a continuation of application No. PCT/US2016/054995, filed on Sep. 30, 2016.

(60) Provisional application No. 63/007,352, filed on Apr. 8, 2020, provisional application No. 62/255,332, filed on Nov. 13, 2015.

(51) Int. Cl.
| | |
|---|---|
| *G01T 1/02* | (2006.01) |
| *G04B 37/08* | (2006.01) |
| *H01L 27/146* | (2006.01) |
| *G01T 1/36* | (2006.01) |
| *G01T 3/06* | (2006.01) |
| *G01T 3/08* | (2006.01) |
| *G01T 1/175* | (2006.01) |
| *G01T 1/18* | (2006.01) |
| *G01T 1/202* | (2006.01) |
| *G01T 1/205* | (2006.01) |
| *G01T 1/208* | (2006.01) |
| *G01T 1/24* | (2006.01) |

(52) U.S. Cl.
CPC .............. *G01T 1/171* (2013.01); *G01T 1/175* (2013.01); *G01T 1/18* (2013.01); *G01T 1/205* (2013.01); *G01T 1/208* (2013.01); *G01T 1/2023* (2013.01); *G01T 1/247* (2013.01); *G01T 1/248* (2013.01); *G01T 1/366* (2013.01); *G01T 3/065* (2013.01); *G01T 3/085* (2013.01); *G04B 37/08* (2013.01); *H01L 27/14658* (2013.01)

(58) Field of Classification Search
CPC ......... G01T 1/18; G01T 1/2023; G01T 1/205; G01T 1/208; G01T 1/247; G01T 1/248; G01T 1/366; G01T 3/065; G01T 3/085; G04B 37/08; H01L 27/14658
See application file for complete search history.

(56) References Cited

U.S. PATENT DOCUMENTS

| | | | |
|---|---|---|---|
| 4,994,673 A * | 2/1991 | Perna | .................... G01T 1/2002 250/361 R |
| 5,243,281 A * | 9/1993 | Ahonen | ............. G01R 33/0358 324/248 |
| 5,844,781 A | 12/1998 | Schlotterer et al. | |
| 8,212,221 B2 | 7/2012 | Stein et al. | |
| 8,373,130 B2 | 2/2013 | Ronda et al. | |
| 10,031,239 B2 | 7/2018 | Fontbonne | |
| 10,234,576 B2 | 3/2019 | Marriott et al. | |
| 10,782,422 B2 * | 9/2020 | Liang | ........................ G01T 1/18 |
| 2007/0075251 A1 | 4/2007 | Doughty | |
| 2011/0006195 A1 * | 1/2011 | Prendergast | ............ G01T 1/247 250/252.1 |
| 2011/0036988 A1 | 2/2011 | Campbell | |
| 2011/0251828 A1 | 10/2011 | Scoullar | |
| 2014/0209805 A1 * | 7/2014 | Stowe | ................... G01T 1/2023 250/362 |
| 2016/0081637 A1 | 3/2016 | Noshi | |
| 2017/0090041 A1 | 3/2017 | Yokoyama | |
| 2018/0267174 A1 | 9/2018 | Liang et al. | |
| 2020/0124745 A1 * | 4/2020 | Leder | ........................ G01T 3/06 |

FOREIGN PATENT DOCUMENTS

| | | | |
|---|---|---|---|
| JP | H10 186041 | 7/1998 | |
| JP | 2003/194948 | 7/2003 | |
| JP | 4131912 B2 | 8/2008 | |
| JP | 2009/229127 | 10/2009 | |
| JP | 2009277910 A * | 11/2009 | ............. H01L 23/02 |
| JP | 5043728 B2 | 10/2012 | |
| WO | WO 2012111492 | 8/2012 | |
| WO | WO 2015/012191 | 1/2015 | |
| WO | WO 2015081134 | 6/2015 | |

* cited by examiner

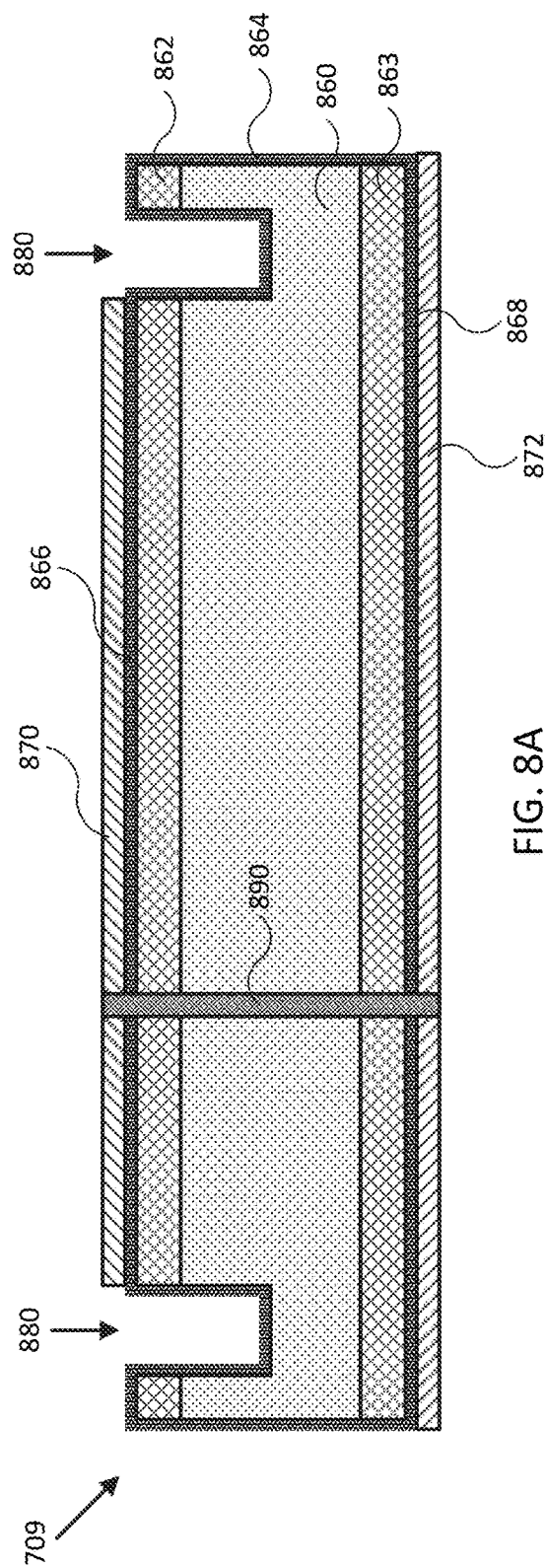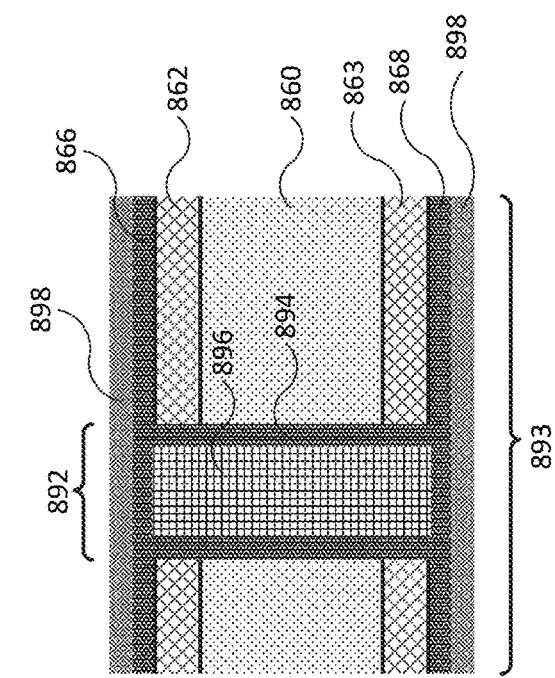

SEALED RADIATION DETECTOR MODULE SYSTEMS AND METHODS

CROSS-REFERENCE TO RELATED APPLICATIONS

This application claims the benefit of and priority to U.S. Provisional Patent Application No. 63/007,352 filed Apr. 8, 2020 and entitled "SEALED RADIATION DETECTOR MODULE SYSTEMS AND METHODS," which is hereby incorporated by reference in its entirety.

This application is a continuation-in-part of U.S. patent application Ser. No. 15/953,105 filed Apr. 13, 2018 and entitled "DOSE RATE MEASUREMENT SYSTEMS AND METHODS," which is hereby incorporated by reference in its entirety.

U.S. patent application Ser. No. 15/953,105 is a continuation of International Patent Application No. PCT/US2016/054995 filed Sep. 30, 2016 and entitled "DOSE RATE MEASUREMENT SYSTEMS AND METHODS," which is hereby incorporated by reference in its entirety.

International Patent Application No. PCT/US2016/054995 filed Sep. 30, 2016 claims priority to and the benefit of U.S. Provisional Patent Application No. 62/255,332 filed Nov. 13, 2015 and entitled "DOSE RATE MEASUREMENT SYSTEMS AND METHODS," which is hereby incorporated by reference in its entirety.

This application is related to U.S. patent application Ser. No. 15/164,775 filed May 25, 2016 now U.S. Pat. No. 9,835,735 B2 which issued Dec. 5, 2017 and entitled "SiPM-BASED RADIATION DETECTION SYSTEMS AND METHODS," which is a continuation of International Patent Application No. PCT/US2014/067489 filed Nov. 25, 2014 and entitled "SiPM-BASED RADIATION DETECTION SYSTEMS AND METHODS," which claims the benefit of and priority to U.S. Provisional Patent Application No. 61/909,311 filed Nov. 26, 2013 and entitled "SiPM-BASED RADIATION DETECTION SYSTEMS AND METHODS," all of which are hereby incorporated by reference in their entirety.

TECHNICAL FIELD

One or more embodiments of the invention relate generally to radiation detection systems and more particularly, for example, to systems and methods for providing radiation detector modules for use in radioactive environments.

BACKGROUND

Radiation detectors have traditionally been used to measure the energy and count rate of detected radiation in order to identify sources of radiation or to calculate dose rate. For example, conventional radiation detectors typically use a scintillator coupled to a photomultiplier to convert incident radiation to electrical pulses, and the energy of the incident radiation can be determined from characteristics of the pulses. The energy of the incident radiation can be used to identify its source, and a counting of events, combined with their specific energies, can be used to determine a dose rate.

Each pulse has a characteristic shape that can have a length as long as multiple microseconds, and so each measurement conventionally takes just as long. During a pulse measurement process, conventional radiation detectors ignore subsequent signals until the present measurement is complete, and so fewer events are processed, thereby resulting in instrumental dead time for the radiation detector. Such dead time either produces inaccurate energy and/or dose rate measurements or requires prolonged exposure to the radiation environment to increase the statistical accuracy of one or the other measurements, neither circumstance being desirable, especially in highly radioactive environments. Thus, there is a need for an improved methodology for detecting radiation that reduces instrumental dead time, particularly when energy detection, source identification, and/or dose rate are determined in highly radioactive environments. Moreover, there is a need for radiation detector modules for use with such systems.

SUMMARY

Techniques are disclosed for systems and methods to detect radiation accurately, and particularly in a highly radioactive environment. In one embodiment, a system includes a detector module for a radiation detector, where the detector module is configured to provide radiation detection event signals corresponding to incident ionizing radiation; and a parallel signal analyzer configured to receive the radiation detection event signals and provide a spectroscopy output and a dose rate output. The parallel signal analyzer may be configured to analyze the radiation detection event signals in parallel in first and second analysis channels according to respective first and second measurement times; and determine the spectroscopy output and the dose rate output based on radiation detection event energies determined according to the respective first and second measurement times.

In another embodiment, a method includes receiving radiation detection event signals corresponding to incident ionizing radiation from a detector module for a radiation detector; analyzing the radiation detection event signals in parallel in first and second analysis channels according to respective first and second measurement times; and determining a spectroscopy output and a dose rate output based on radiation detection event energies determined according to the respective first and second measurement times.

In a further embodiment, a radiation detector module includes a metallic and/or metalized enclosure; a radiation sensor disposed within the enclosure; readout electronics configured to provide radiation detection event signals corresponding to incident ionizing radiation in the radiation sensor; and a cap including an internal interface configured to couple to the readout electronics and an external interface configured to couple to a radiation detector, where the cap is configured to hermetically seal the radiation sensor within the enclosure. For example, the cap may be implemented as an edge plated printed circuit board (PCB) including a slot configured to mate with a planar edge of an open surface of the enclosure, where the slot of the cap is soldered to the planar edge of the enclosure to hermetically seal the radiation sensor within the enclosure.

In another embodiment, a method includes providing a metallic and/or metalized enclosure; providing a cap implemented by an edge plated printed circuit board (PCB) including a slot configured to mate with a planar edge of an open surface of the enclosure; coupling a radiation sensor and readout electronics to an interior surface of the cap, where the readout electronics are configured to provide radiation detection event signals corresponding to incident ionizing radiation in the radiation sensor; and hermetically sealing the radiation sensor within the enclosure using the cap to form a radiation detector module. The cap may include an internal interface configured to couple to the readout electronics and an external interface configured to couple to a radiation detector, and the hermetically sealing the radiation sensor within the enclosure may include soldering the slot of the cap to the planar edge of the enclosure to hermetically seal the radiation sensor within the enclosure.

The scope of the invention is defined by the claims, which are incorporated into this section by reference. A more complete understanding of embodiments of the invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

FIGS. 8A-B illustrate cross sectional views of a cap for a detector module in accordance with embodiments of the disclosure.

Embodiments of the invention and their advantages are best understood by referring to the detailed description that follows. It should be appreciated that like reference numerals are used to identify like elements illustrated in one or more of the figures.

DETAILED DESCRIPTION

Figure 1:
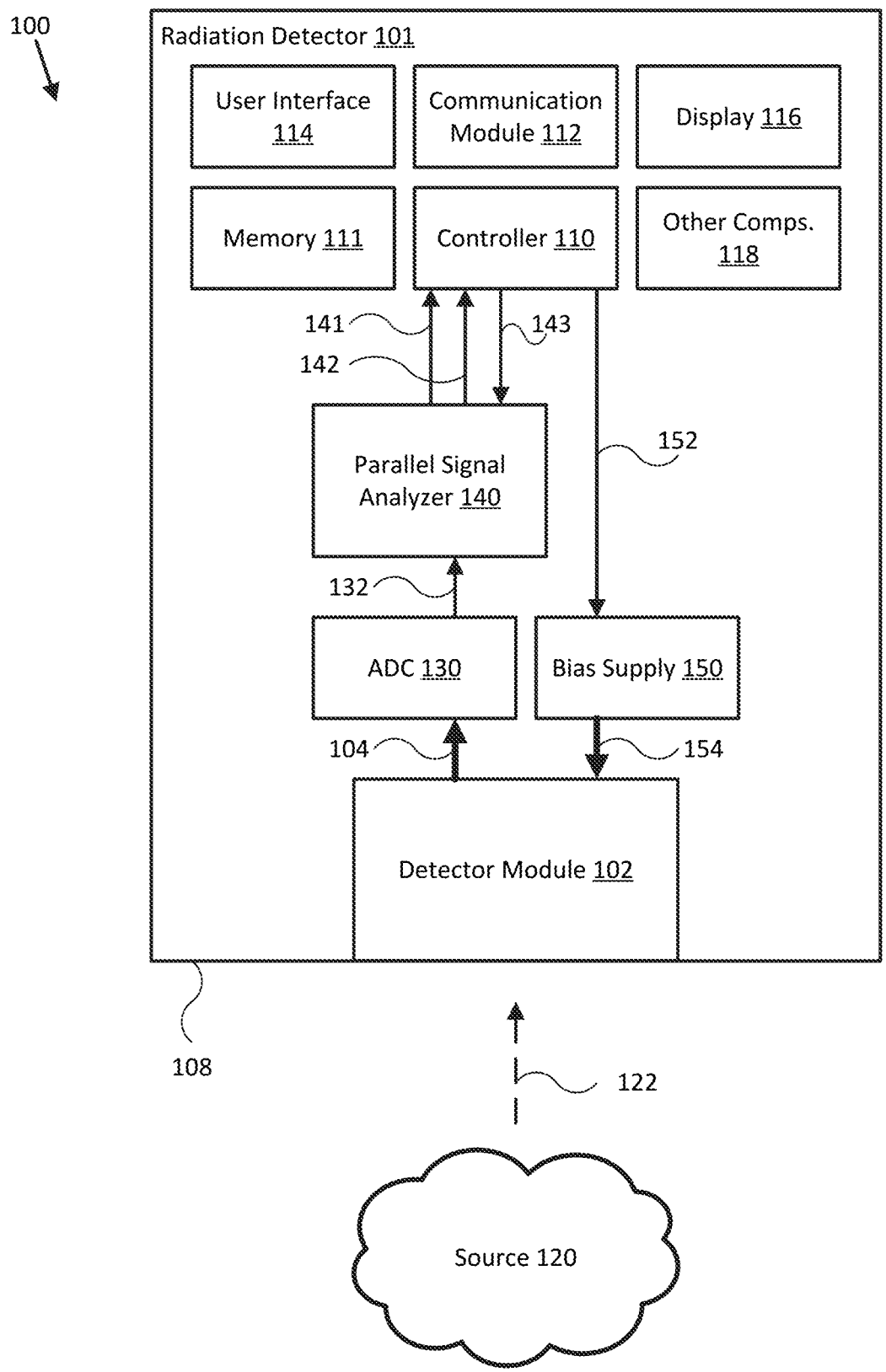
FIG. 1 illustrates a block diagram of a radiation detection system in accordance with an embodiment of the disclosure.

Embodiments of the present disclosure are able to provide substantially simultaneous and reliable spectroscopic and dose rate measurements in high radiation environments. Specifically, embodiments perform parallel spectroscopic and dose rate analysis on signals corresponding to radiation detection events. The spectroscopic analysis is performed according to a first measurement latency (e.g., a charge integration time and/or a pulse shaping time) that emphasizes accurate determination of the energies of radiation detection events, and the dose rate analysis is performed according to a second measurement latency that can be adjusted (e.g., based on the rate of radiation detection events) to emphasize throughput over accuracy and to reduce the effective dead time associated with the dose rate measurements. As a result, embodiments provide accurate and reliable spectroscopic and dose rate measurements in variable and/or high radiation environments, where the rate of radiation detection events would otherwise result in substantial instrumental dead time and either poor spectroscopic fidelity or inaccurate dose rate reporting. In some embodiments, the parallel processing allows dose rate measurements to be at least partially calibrated by coincident spectroscopic measurements, as described herein.

Radiation detectors measure the energy and count rate of radiation to identify radioactive isotopes and calculate dose rate. Personal radiation detectors (PRDs) and/or spectroscopic PRDs (SPRDs) are typically required to provide isotope identification and the present dose rate in all environments, including highly radioactive environments where the overall count rate of radiation detection events is relatively high. In general, radiation detectors employ a detector module to convert incident radiation to electrical pulses. The energy of the radiation detection events can be determined by integrating the charge of the pulses or shaping the pulses to a proper form for pulse-height measurement and comparing with calibration.

For each type of detector module (e.g., for each type of scintillator and/or scintillator/readout pair), there is an optimum charge integration or pulse shaping time corresponding to an optimum energy resolution for the resulting measurements (e.g., shorter times result in relatively poor energy resolution and/or measurement accuracy, and longer times do not appreciably increase the resolution or accuracy). The optimum analysis time (e.g., charge integration or pulse shaping time) is typically proportional to the pulse decay time, which is characteristic to the material used for the scintillator and the type or arrangement of photomultipliers used for the detector module. During the analysis, subsequent overlapping signals may be ignored until the analysis is complete, and ignored events result in instrumental dead time (e.g., the ratio of the rejected/ignored signals to the total number of received signals).

When the counting rate is low, such as in a low radioactive environment, a relatively long analysis time may be used to preserve optimum energy resolution without risk of substantial instrumental dead time. However, when encountering a highly radioactive source, using a long analysis time can result in substantial instrumental dead time, which is undesirable. Embodiments of the present disclosure can detect when the dead time or counting rate is higher than preset thresholds and dynamically decrease the analysis time so that the corresponding instrumental dead time is below the threshold. In various embodiments, a user may select the threshold to balance the potential impact of poorer energy resolution for isotope identification against prolonged measurements.

Embodiments of the present disclosure are intended to be implemented in radiation detectors generally, and more particularly in PRDs and SPRDs, which are typically portable. Typical elements of a radiation detector include a detector module, various electrical components, such as amplifiers, analog to digital converters (ADCs), and/or bias supplies, and various signal processing electronics. For example, in some embodiments, the energy of incident radiation may be obtained using signal processing implemented as circuitry and/or software residing in microprocessors, field programmable gate arrays (FPGAs), and/or other electronic devices to analyze the electronic pulses provided by a detector module.

In various embodiments, portable radiation detectors may include two general types of detector modules: scintillator (e.g., NaI, CsI, LaBr, CLYC) based detector modules and semiconductor (e.g., Ge, CdZnTe) based detector modules. When radiation strikes a scintillator, optical photons are generated, and the photons are converted to photoelectrons by photomultipliers such as photomultiplier tubes and/or silicon photomultipliers (SiPMs). In the case of semiconductor based detector modules, electron-hole pairs are generated by interaction of the semiconductor material with incident radiation, and the resulting signals can be analyzed using the same techniques used to analyze the signals produced by the photomultipliers. For example, the charges produced by the photomultiplier or semiconductor may form pulses that can be amplified by a pre-amplifier, digitized, and provided to signal analyzers.

The amplitudes of the pulses are a measure of the energy of the incident radiation, which can be used for isotope identification (e.g., by matching the energy and/or distribution of a measured energy spectrum to a known energy spectrum). In order to determine the energy of the incident radiation, signal analyzers may integrate the pulse over time to obtain the total charge, for example, or shape the pulse to a particular characteristic line shape (e.g., a Gaussian and/or other line shape, which may be intrinsic to the type of detector module used) for peak detection, both of which can be used to determine the energy of the measured event. Spectroscopy analysis may include calibration and/or stabilization of the measurement process, energy peak detection, noise reduction, source identification, and/or other spectroscopy analysis and/or processing configured to provide an energy spectrum of incident radiation, for example. Dose rate analysis may include similar spectroscopy analysis, for example, coupled with event counting, statistical estimations of absorption, and/or other dose rate analysis and/or processing configured to provide a measure of the energy imparted to matter by incident radiation.

FIG. 1 illustrates a block diagram of a radiation detection system 100 in accordance with an embodiment of the disclosure. As shown by the embodiment presented in FIG. 1, radiation detector 101 may include a variety of components adapted to detect ionizing radiation 122 produced by source 120 and report detections, spectroscopy measurements, and/or dose rate measurements to other devices or a user as described herein. For example, system 100 may report the detection of radiation by aggregating detection data to provide an accumulated dosage, spectrograph, or material identification of radiation detected by system 100, and then transmitting the radiation data to a display, such as display 116. In other embodiments, system 100 may report detections by energizing an LED indicator (e.g., user interface 114) and/or transmitting an alert or notification signal (e.g., using communication module 112) to a component (e.g., an alarm, or an electrical switch or relay) of a notification system.

In the embodiment shown in FIG. 1, radiation detector 101 includes detector module 102. Detector module 102 may be implemented with a variety of structures and materials adapted to interact with ionizing radiation 122 to produce electrical signals or pulses that may, in-turn, be analyzed (e.g., by ADC 130, parallel signal analyzer 140, and/or controller 110) to provide spectroscopy measurements, dose rate measurements, and/or other radiation data, as described herein. In general, detector module 102 may be configured to receive bias 154 and/or other control signals from bias supply 150, controller 110, and/or other elements of system 100, for example, and provide radiation detection event signals 104 to ADC 130, parallel signal analyzer 140, and/or controller 110.

In various embodiments, detector module 102 may be implemented with a scintillator sensor and photomultiplier and/or a semiconductor sensor configured to provide analog electrical signals (e.g., radiation detection event signals 104) corresponding to radiation detection events caused by ionizing radiation 122 interacting with the scintillator sensor and/or semiconductor sensor of detector module 102. As described more fully herein, detector module 102 may in some embodiments be implemented as a removable and/or replaceable cartridge or can be configured to interface with housing 108 and/or other elements of radiation detector 101.

Each of controller 110, memory 111, user interface 114, communication module 112, display 116, other components 118, ADC 130, parallel signal analyzer 140, and/or bias supply 150, if optionally included in detector 101, may be coupled to a common PCB or to housing 108, for example, depending on a desired application and/or overall size of radiation detector 101. In other embodiments, any one or group of such components may be implemented externally to radiation detector 101, for example, and/or in a distributed or grouped manner (e.g., multiple controllers 110 operating radiation detector 101, or multiple radiation detectors 101 operated by a single controller 110).

In various embodiments, controller 110 may be implemented as any appropriate logic device (e.g., microcontroller, processor, application specific integrated circuit (ASIC), field programmable gate array (FPGA), or other logic device) that may be used by system 100 to execute appropriate instructions, such as software instructions and/or signal processing operations for detecting radiation using detector module 102. Further, controller 110 may be implemented with various signal processing devices, such as analog to digital converters (ADCs), trigger inputs, timing circuitry, and other signal processing devices as described herein.

In various embodiments, at least some portion or some functionality of controller 110 may be part of or implemented with other existing logic devices of separate systems, such as a server, a personal electronic device (e.g., a mobile phone, smartphone, tablet device, laptop computer, desktop computer), and/or any other device that may be used to process, report, or act on radiation detected by system 100. In other embodiments, controller 110 may be adapted to interface and communicate with various external logic devices and associated components and/or perform various operations in a distributed manner (e.g., using communications module 112).

In general, controller 110 may be adapted to interface and communicate with other components of system 100 to perform the methods and processes described herein. For example, controller 110 may be adapted to perform gross counting operations, spectrometry, and/or various stabilization/calibration methods, as described herein. In one embodiment, controller 110 may be adapted to use communication module 112 to report radiation detection to display 116 and display a dose amount or rate or an alert notification, for example, or display an image of a spectrographic map of source 120. In another embodiment, controller 110 may be adapted to use communication module 112 to establish a wired or wireless communication link with an external notification system, for example, and report counts, energies, transient characteristics, dose rates, and/or other characteristics of detected radiation.

ADC 130 may be implemented as any analog to digital converter and/or any appropriate logic device and/or analog circuitry configured to receive analog radiation detection event signals 104 from detector module 102 and provide digitized radiation detection event signals 132 to parallel signal analyzer 140.

Parallel signal analyzer 140 may be implemented as any analog and/or digital device and/or circuitry configured to receive radiation detection event signals 132 and analyze the signals at least two parallel analysis channels to provide spectroscopy output 141 and dose rate output 142 to controller 110. For example, in some embodiments, parallel signal analyzer 140 may be implemented by an FPGA with portions of the FPGA allocated to analyze radiation detection event signals 132 using a spectroscopy pulse analyzer, for example, and other portions of the FPGA allocated to analyze radiation detection event signals 132 using a does rate pulse analyzer, where a measurement time for the dose rate pulse analyzer and/or the spectroscopy pulse analyzer may be adjusted (e.g., by controller 110 using control signals 143) to adjust a corresponding instrumental dead time for one or both analyzers. In various embodiments, parallel signal analyzer 140 may be configured to perform such split, dual, or parallel analysis substantially simultaneously. In some embodiments, the simultaneous parallel analysis allows dose rate measurements to be at least partially or periodically calibrated by coincident spectroscopic measurements, as described herein.

Bias supply 150 may be implemented as any appropriate logic device and/or analog circuitry configured to receive bias control signal 152 from controller 110 and provide bias 154 to detector module 102. For example, bias supply 150 may be configured to generate and supply a bias voltage to detector module 102 to help detector module 102 provide responses substantially proportional to the energy of incident ionizing radiation 122. In various embodiments, bias supply 150 may also be configured to provide power and/or other signals and/or control signals (e.g., by controller 110) to detector module 102.

Although shown in FIG. 1 as separate, controller 110, ADC 130, parallel signal analyzer 140, and/or bias supply 150 may be partially or wholly integrated into one or more monolithic logic devices and/or analog components. In some embodiments, ADC 130 and/or bias supply 150 may be integrated with detector module 102 so as to reduce a risk of analog signal interference and/or noise injection into the measurement process.

Memory 111 is typically in communication with at least controller 110 and may include one or more memory devices (e.g., memory components) to store information, including radiation detection data, calibration data, other types of sensor data, and/or software instructions. For example, memory 111 may include an isotope identification library, which may be updated, adjusted, and/or otherwise managed by a user through interaction with user interface 114. Such memory devices may include various types of volatile and non-volatile information storage devices, such as RAM (Random Access Memory), ROM (Read-Only Memory), EEPROM (Electrically-Erasable Programmable Read-Only Memory), flash memory, a disk drive, and/or other types of memory. In one embodiment, memory 111 may include a portable memory device that can be removed from system 100 and used to convey stored data to other systems for further processing and inspection.

Communication module 112 may be configured to facilitate communication and interfacing between various components of system 100 (e.g., between controller 110 and memory 111 and/or display 116) and/or various external devices, such as a wireless access point, a personal electronic device, a server, and/or other detectors. For example, components such as user interface 114 and display 116 may transmit and receive data to and from controller 110 through communication module 112, which may be adapted to manage wired and/or wireless communication links between the various components. As such, communication module 112 may support various interfaces, protocols, and standards for local system networking, such as the controller area network (CAN) bus, the local interconnect network (LIN) bus, the media oriented systems transport (MOST) network, or the ISO 11738 (or ISO bus) standard.

In some embodiments, controller 110 may be adapted to communicate, via communication module 112, with a remote user interface, a notification system, or other detection systems to, for example, aggregate reports from multiple systems or sensors and/or implement a particular detection and/or notification method. As such, communication module 112 may include a wireless communication component (e.g., based on the IEEE 802.11 Wi-Fi standards, the Bluetooth™ standard, the ZigBee™ standard, or other appropriate short range wireless communication standards), a wireless broadband component (e.g., based on WiMAX technologies), a mobile cellular component, a wireless satellite component, or other appropriate wireless communication components. Communication module 112 may also be configured to interface with a wired network and/or device via a wired communication component, such as an Ethernet interface.

User interface 114 provides user interaction with detector 101 and may include one or more buttons, indicators (e.g., LEDs), keyboards, trackballs, knobs, joysticks, displays (e.g., a liquid crystal display, a touch-screen display), and/or other type of user interface adapted to accept user input and/or provide user feedback. In one embodiment, user interface 114 may include a power button, a vibration motor, an LED to indicate a radiation detection event (e.g., a count), and/or a speaker to provide an audible indication of a detection event (e.g., visible, tactile, and/or audible indicators) and/or a dose or dose rate. In various embodiments, user interface 114 may be used to input a variety of system configuration settings, such as stabilization/calibration parameters, as described herein. In some embodiments, user interface 114 may be used to view one or more reports, graphs, and/or other radiation detection data captured by system 100 and/or processed according to the various operations described herein.

Display 116 may be configured to present, indicate, or otherwise convey alerts, notifications, counts, dose rates, and/or other reports of radiation detection (e.g., generated by controller 110). Display 116 may be implemented with an electronic display screen, such as a liquid crystal display (LCD), a cathode ray tube (CRT), or various other types of generally known video displays and monitors, including touch-sensitive displays. Display 116 may be suitable for presenting radiation detection data, graphs, images, reports, or other information as described herein.

Other components 118 may include various stabilization/calibration devices such as a temperature sensor/probe (e.g., a thermocouple, an infrared thermometer), an LED or laser diode (e.g., to provide a known photon source), an ambient light sensor, a voltage regulator and/or filter, a variable voltage source, and/or other types of devices that can be used to facilitate stabilization or calibration, as described herein. Sensor data from such sensors may be utilized by controller 110 to detect stabilization/calibration parameters related to detector 101, and thereby produce more reliable reports of detecting radiation. In some embodiments, other components 118 may include a GPS, accelerometer, compass, and/or other orientation sensor capable of sensing a positions and/or orientation of detector 101. Other components 118 may additionally include a power module implemented as a battery, a power adapter, a charging circuit, a power interface, a power monitor, and/or other type of power supply providing a stationary or mobile power source. In some embodiments, the power module may be adapted to provide uninterruptible power and/or power conditioning to protect continued operation of detector 101. In various embodiments, other components 118 may include an interface to a removable or replaceable detector module 102.

Other components 118 may also include a shutter disposed over an end of detector module 102 and/or a variety of other electrical and/or electronic components coupled to and/or supported by housing 108. In some embodiments, a shutter may be implemented as a mechanical or removable radiation shield adapted to selectively block or substantially reduce one or more components of ionizing radiation 122. For example, a shutter may be implemented with a high-Z material capable of substantially blocking alpha, beta, and relatively low energy gamma radiation from entering detector module 102, but allowing neutron and/or high energy gamma radiation. In various embodiments, a shutter may be actuated (e.g., opened and/or closed) electronically by controller 110, for example. Such shutter may be coupled to/supported by housing 108, for example, and housing 108 may be adapted to provide similar or differentiated radiation shielding relative to the shutter. In some embodiments, a shutter and/or housing 108 may be implemented, at least in part, using lead and/or tungsten panels, foil, and/or other structures, as described herein. In some embodiments, housing 108 may be adapted to protect system 100 from environmental conditions associated with space or atmospheric flight, and/or other outdoor environmental conditions, such as stationary or articulated mounting on a terrestrial structure, for example. In other embodiments, housing 108 may be adapted for handheld use.

Figure 2:
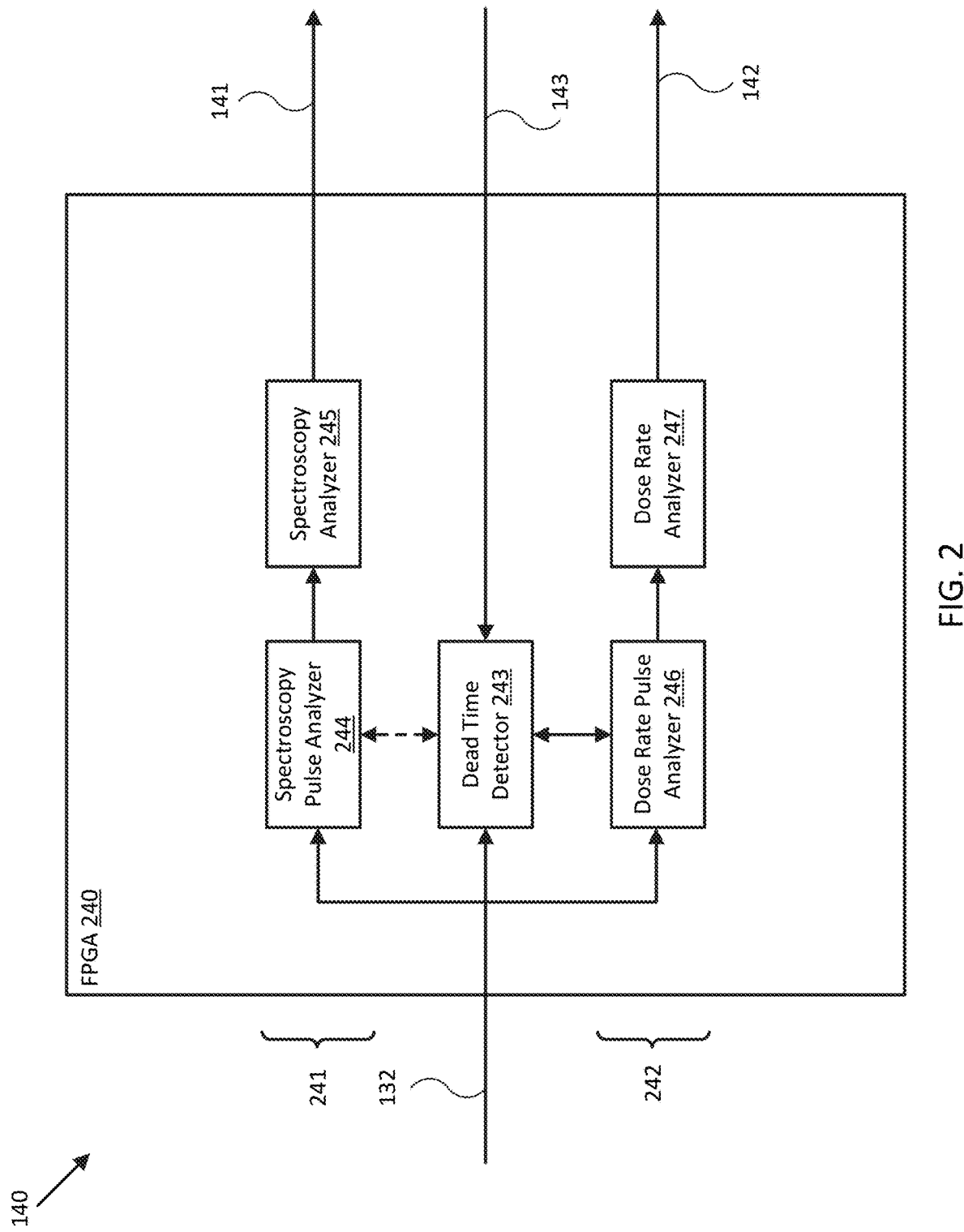
FIG. 2 illustrates a block diagram of a signal analyzer for a radiation detection system in accordance with an embodiment of the disclosure.

FIG. 2 illustrates a block diagram of parallel signal analyzer 140 for radiation detection system 100 in accordance with an embodiment of the disclosure. As shown in FIG. 2, parallel signal analyzer 140 may be implemented with FPGA 240, for example, and may include parallel analysis channels 241 and 242 configured to receive radiation detection event signals 132 and provide spectroscopy output 141 and dose rate output 142, as shown. Analysis channel 241 may correspond to a spectroscopy analysis channel, for example, and include spectroscopy pulse analyzer 244 and spectroscopy analyzer 245 optionally coupled to dead time detector 243. Analysis channel 242 may correspond to a dose rate analysis channel, for example, and include dose rate pulse analyzer 246 and dose rate analyzer 247 coupled to dead time detector 243.

Dead time detector 243 may be implemented as any digital and/or analog circuitry and/or software executed by FPGA 240 configured to detect and count the number of radiation detection events in radiation detection event signals 132 to determine a count rate for radiation detection event signals 132, compare that number to the analysis throughputs of dose rate pulse analyzer 246 and/or spectroscopy pulse analyzer 244 to determine corresponding instrumental dead times for dose rate pulse analyzer 246 and/or spectroscopy pulse analyzer 244, and provide measurement times to dose rate pulse analyzer 246 and/or spectroscopy pulse analyzer 244 based on the comparisons, the dead times, and/or one or more control signals 143 provided by controller 110. For example, in some embodiments, control signals 143 may include a threshold dead time or count rate, a measurement time adjustment, a selection of an analysis channel to adjust, and/or other control signals. In various embodiments, dead time detector 243 may be configured to dynamically provide a measurement time to either or both pulse analyzers 244 and 246 to reduce an instrumental dead time of pulse analyzer 244 and/or 246 below a threshold dead time.

Spectroscopy pulse analyzer 244 and/or dose rate pulse analyzer 246 may be implemented as integrators, pulse shape detectors, various filters and transforms (e.g., multipole filters), and/or any digital and/or analog circuitry and/or software executed by FPGA 240 configured to determine a characteristic of radiation detection event signals 132 corresponding to energies of radiation detection events. In various embodiments, dose rate pulse analyzer 246 (and, optionally, spectroscopy pulse analyzer 244) may be configured to determine the characteristic subject to a set measurement time provided and/or adjusted by dead time detector 243.

For example, pulse analyzers 244 and 246 may be implemented as integrators configured to integrate pulses of radiation detection event signals 132 for a set measurement time (e.g., provided by control signals 143 and/or dead time detector 243) to determine the energies of the pulses (e.g., the energies of radiation detection events corresponding to the pulses). Such set measurement time may be measured from a detected pulse peak, for example. In other embodiments, pulse analyzers 244 and 246 may be implemented as pulse shape detectors configured to compare and conform a characteristic line shape to each pulse (e.g., by varying a gain and/or other parameter of the line shape and minimizing the error between the line shape and the pulse), along a set measurement time, to determine the energies of the pulses.

In further embodiments, pulse analyzers 244 and 246 may be implemented as one or more filters and/or transforms that may be used to operate on the pulses and determine the energies of the pulses. For example, such filters may include one or more trapezoid filters, Gaussian shaping filters, asymmetric filters, and/or other filters and/or transforms that can be applied to pulses and used to shape the pulses, along a set measurement time, to facilitate measurement or recovery of peak amplitudes of the pulses and determine energies of the pulses. Such analysis may be referred to as multipole filtering (e.g., including one or more filters each characterized by one or more poles). In some embodiments, such processing may include one or more convolution filters configured to convolve each pulse with a known pulse shape, along a set measurement time, to determine the energies of the pulses.

In general, pulse analyzers 244 and 246 are configured to receive radiation detection event signals 132 and perform parallel analysis of radiation detection event signals 132 through relatively long measurement time analysis performed by spectroscopy pulse analyzer 244 of analysis channel 241 and relatively short measurement time analysis performed by dose rate pulse analyzer 246 of analysis channel 242. The long measurement time (e.g., slow) analysis integration yields high fidelity information that may be used for accurate high resolution and reliable spectroscopy. The short measurement time (e.g., fast) analysis favors throughput of completed measurements to achieve a higher effective dose rate range. Longer measurement times/analyses effectively collect more of the light emitted from the scintillator sensor and/or more of the signal emitted by the semiconductor sensor, where shorter measurement times/analyses effectively collect the bulk of the light/signals, but trade detection fidelity for throughput and a reduction in instrumental dead time.

Spectroscopy analyzer 245 may be implemented as any digital and/or analog circuitry and/or software executed by FPGA 240 configured to receive energies of radiation detection events from spectroscopy pulse analyzer 244 and provide spectroscopy output 141. Spectroscopy output 141 may include a spectrograph of radiation detection events, an isotope identification, calibrated and/or stabilized spectroscopy data, and/or other spectroscopy data associated with radiation detected by radiation system 100.

In some embodiments, spectroscopy analyzer 245 (and/or controller 110) may be configured to perform energy windowing on the energies provided by spectroscopy pulse analyzer 244 to, for example, filter selected energies and/or spectrums (e.g., of naturally occurring radioactive materials) out of spectroscopy output 141, thereby reducing nuisance alarms and/or improving operational sensitivity of spectroscopy output 141 and/or detection data provided or displayed by radiation detector 101.

Dose rate analyzer 247 may be implemented as any digital and/or analog circuitry and/or software executed by FPGA 240 configured to receive energies of radiation detection events from dose rate pulse analyzer 246 and provide dose rate output 142. Dose rate output 142 may include a cumulative and/or absorbed dose and/or dose rate, one or more aspects of spectroscopy output 141, and/or other dose rate data associated with radiation detected by radiation system 100.

Although parallel signal analyzer 140 in FIG. 2 shows first and second analysis channels 241 and 242, in other embodiments, parallel signal analyzer 140 may include three or more different parallel analysis channels, for example, where each parallel analysis channel may be configured to perform spectroscopy analysis, dose rate analysis, and/or other types of analysis, each according to a different measurement time (e.g., as set and/or controlled by their individual pulse analyzers, dead time detector 243, and/or controller 110).

Figure 3A:
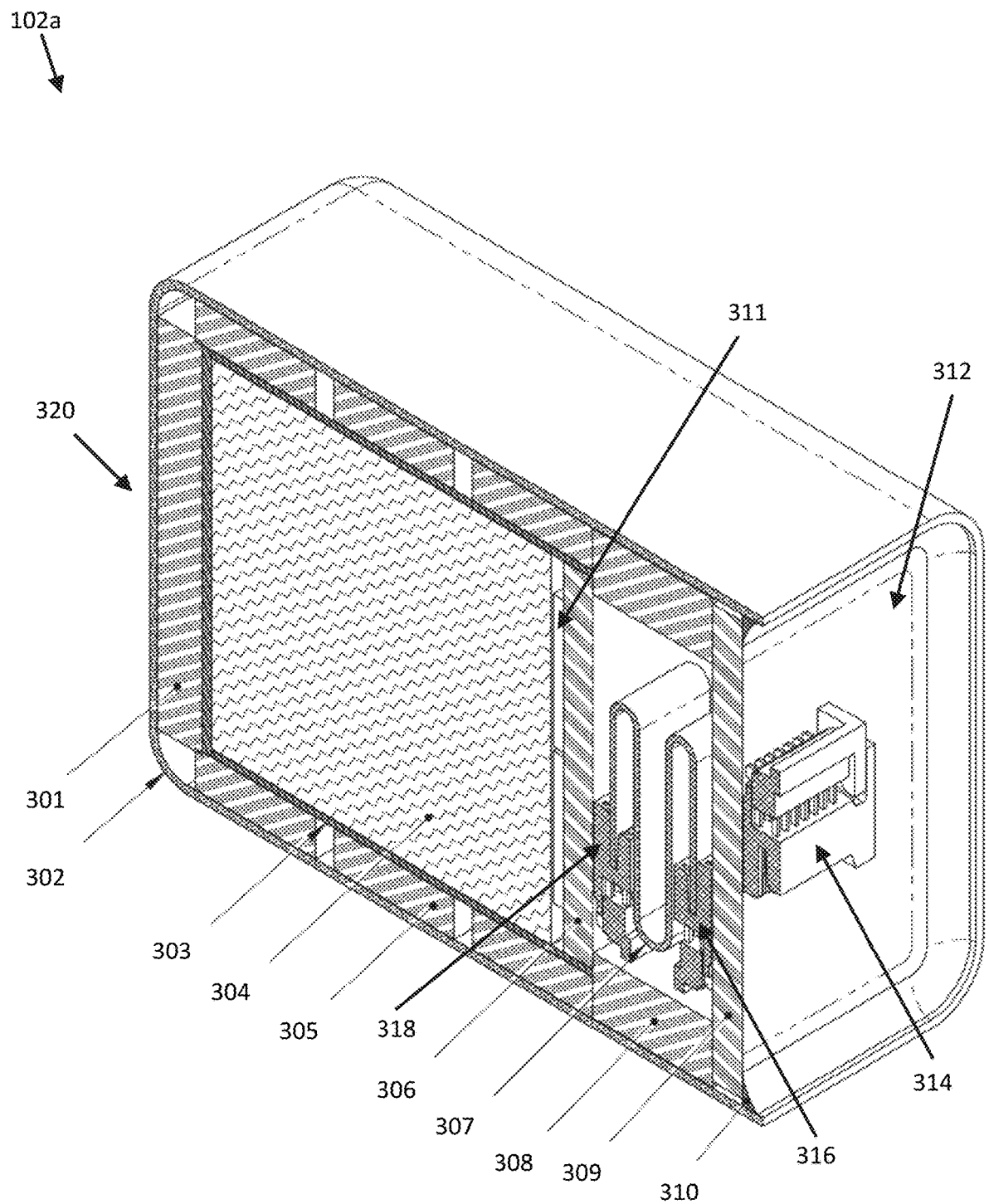
FIG. 3A illustrates a perspective cross sectional view of a detector module for a radiation detection system in accordance with an embodiment of the disclosure.

FIG. 3A illustrates a perspective cross sectional view of a detector module 102a for a radiation detection system in accordance with an embodiment of the disclosure. In particular, the embodiment shown in FIG. 3A provides a solution to the problem of hermetically sealing a hygroscopic material (e.g., a variety of different types of scintillator and/or semiconductor sensor materials) in a relatively inexpensive, easy to manufacture, ruggedized housing that omits conventional silicone sealants that otherwise outgas and degrade sensor materials, and that generally deteriorate over time.

In various embodiments, detector module 102a illustrates a system and method for ruggedized encapsulation of a radiation detector sensor that includes a hygroscopic material (e.g., where the sensor performance degrades as its water content increases). For example, as shown in FIG. 3A, detector module 102a includes a metal to printed circuit board (PCB) hermetic seal (e.g., generally shown as solder joint 310) that is formed by soldering a metal enclosure/housing 302 to an edge plated cap PCB 309 that includes a relatively large (e.g., broad and/or thick) ground plane 312 configured to facilitate formation of hermetic seal/solder joint 310 and to facilitate temperature equalization across the PCB and/or between the PCB and the metal enclosure. In various embodiments, such PCB may include a core material that has relatively low moisture adsorption/absorption, such as 96-98% Alumina ($Al_2O_3$), RO4350B™ (e.g., as opposed to the more common FR-4), or Isola FR408HR (e.g., a relatively high performance FR-4 system/laminate variant), so as to provide relatively long term stability with respect to blocking moisture ingress into detector module 102a.

Cap 309 may include various conductive vias, insulated from ground plane 312, that couple multi-conductor interfaces/connectors 314 and 316 on opposite sides of cap 309. A sensor 304 (e.g., a scintillator and/or semiconductor sensor) and coupled readout circuitry (e.g., SiPM 311 and/or readout PCB 306) may be held in place by damping inserts 301, 305, and 308 (e.g., foam, rubber, and/or other relatively low-durometer damping material pads or inserts), which may be configured to provide a thermal barrier to the enclosure and to provide shock absorption. In various embodiments, substantially all materials surrounding sensor 304 may be specified to have a low-Z value so as to minimize interference with the photon energy flux distribution of ionizing radiation incident on sensor 304. In other embodiments, portions of various elements of detector module 102a (e.g., portions of enclosure 302, damping inserts 301, 305, and 308, and/or other elements of detector module 102a) may be implemented with relatively high-Z value materials in order to spatially limit the radiation flux through sensor 304, such as forming and/or plating all but end surface 320 of enclosure 302 with a relatively high-Z material.

In one embodiment, detector module 102a may be implemented with a relatively small substantially cubic scintillation crystal (e.g., sensor 304) coupled to SiPM 311, where SiPM 311 is implemented as an array of photomultipliers or SiPM pixels mounted to readout PCB 306. Readout PCB 306 may not be hard-mounted to enclosure 302, and instead be separated from enclosure 302 by form-fit damping inserts 301, 305, and/or 308 that help bind the reflector 303 (e.g., polytetrafluoroethylene (PTFE) reflector tape, or Gore DRP™ reflector material) to sensor 304, bind sensor 304 to SiPM 311, and retain sensor 304 and readout PCB 306 in place within enclosure 302. In various embodiments, the lone electrical and physical connection between readout PCB 306 and cap 309/hermetic seal 310 is a flexible cable 307 that is configured to damp and/or block transmission of mechanical shock or thermal gradients.

In general, the internal assembly of detector module 102a is able to absorb relatively large mechanical shocks from multiple directions by relying on the compressive resistance of the damping inserts, which can be configured to fully cover the outer surfaces of sensor 304 and readout PCB 306. As such, embodiments of the present disclosure provide substantially increased mechanical shock absorption as compared to conventional coil springs, which typically cannot be configured to utilize the same space and provide similar mechanical shock absorption. In some embodiments, one or more of the damping inserts can provide the increased mechanical shock absorption by covering and/or being disposed across more than half, 70%, 80%, and/or 90% the surface area of one or more surfaces of sensor 304. In general, such damping inserts (e.g., damping inserts 301, 305, and/or 308) may be formed from a relatively low durometer material, which can be defined as materials with a Shore A value approximately equal to or less than 40.

In the embodiment shown in FIG. 3A, hermetic seal 310 is implemented by edge plated cap 309, which includes external interface 314 and internal interface 316 on opposite sides, as shown. The edge plating of cap 309 allows cap 309 to be soldered directly to metallic enclosure 302. Cap 309 and/or metal enclosure 302 may be metalized (e.g., plated with tin, cadmium, gold, silver, palladium, rhodium, copper, bronze, brass, nickel silver, beryllium copper, zinc, nickel, and/or combinations of those, and/or using other metallization processes) prior to assembly to facilitate formation of solder joint/hermetic seal 310. In various embodiments, cap 309 may include ground plane 312 (e.g., disposed within and/or on a surface of cap 309) that is connected to the plated edges of cap 309 and that can span substantially the entire planar extent of cap 309 (e.g., except for vias in cap 309 that allow electrical coupling of interfaces 314 and 316). In such embodiments, ground plane 312 may be configured to provide substantially equalized thermal expansion of cap 309 with hermetic seal 310 and enclosure 302, thereby enabling the detector to maintain a reliable hermetic seal over many more temperature cycles than conventional silicone to metal or glass hermetic seals. In various embodiments, hermetic seal 310 may be RoHS compliant, such as being implemented with lead free solder when required.

Figure 3B:
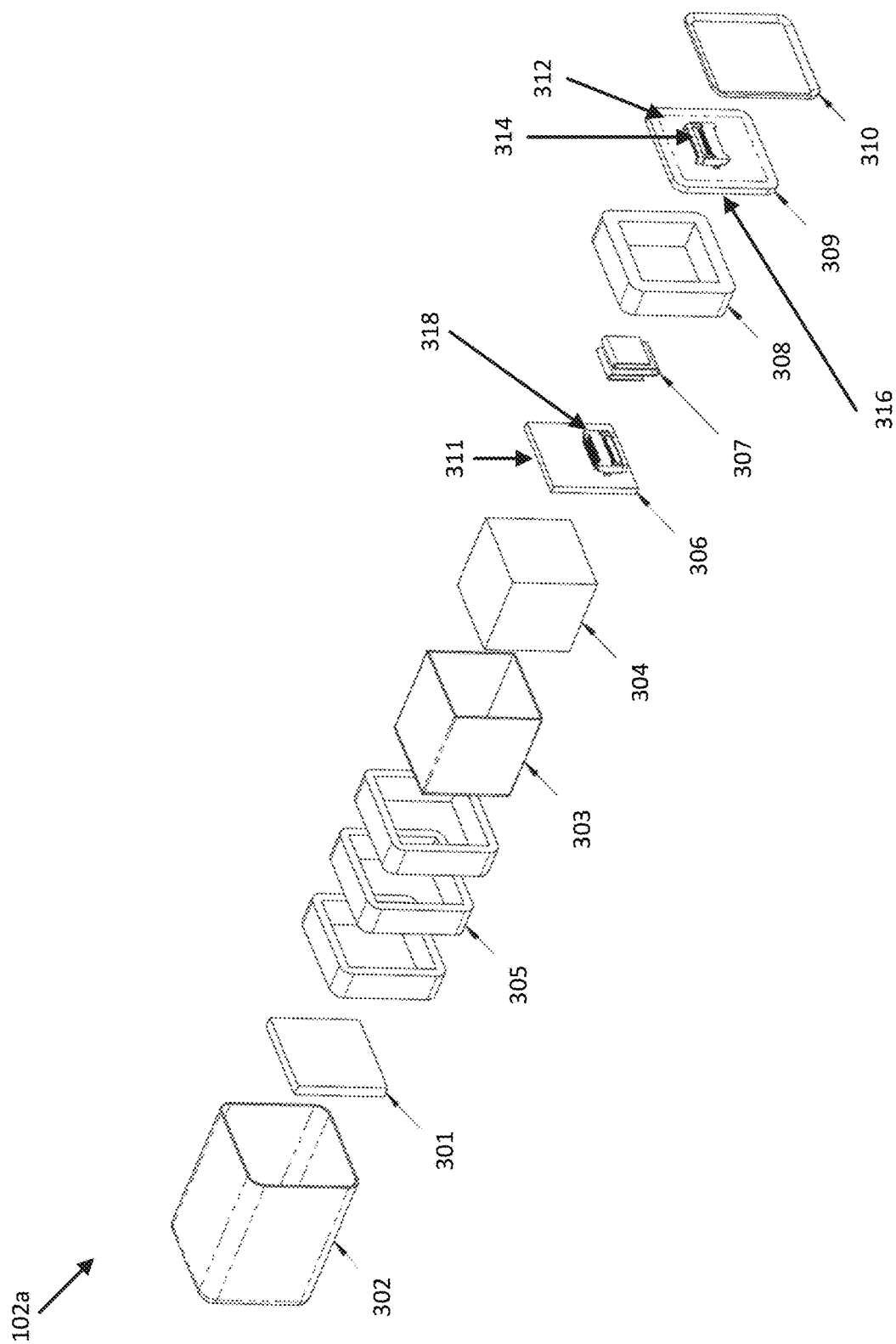
FIG. 3B illustrates an exploded view of a detector module for a radiation detection system in accordance with an embodiment of the disclosure.

FIG. 3B illustrates an exploded view of detector module 102a for a radiation detection system in accordance with an embodiment of the disclosure. As shown in FIGS. 3A and 3B, detector module 102a includes metal enclosure 302 hermetically sealed to cap 309 by solder joint 310. Inside the assembly, sensor 304 may be wrapped in reflector 303 and held in place with damping inserts (e.g., foam padding) 301 and 305. A silicon-based readout/photomultiplier (e.g., SiPM 311) may be surface mounted on readout PCB 306 and held firmly in place and physically separate from cap 309 by damping inserts 305 and 308, as shown. SiPM 311 may be permanently mounted to sensor 304 with an optical adhesive. In some embodiments, sensor 304 and readout PCB 306 are not rigidly connected to any portion of metal enclosure 302, and instead rely on damping or foam inserts (e.g., damping inserts 301, 305, and 308) as a shock absorber capable of dispersing the kinetic energy of the assembly during a sudden mechanical shock. Flexible cable 307 connects readout PCB 306 and cap 309 and is configured to help physically isolate sensor 304 from mechanical shock and/or thermal gradients.

SiPM 311 may be implemented as any silicon-based pixelated semiconductor device adapted to convert photons (e.g., with wavelengths corresponding to those emitted by sensor/scintillator 304) entering pixels into per-pixel electrical signals corresponding to radiation detection events, as described herein. Readout PCB 306 may be a conventional printed circuit board, for example, and be adapted to provide electrical access to SiPM 311 (e.g., through various metal traces and/or readout interface 318) as well as physical support for SiPM 311 and/or readout interface 318. Interfaces 314, 316, and/or 318 may be implemented as relatively small (e.g., relative to a connector used to access a PMT) electrical interface adapted to support analog and/or digital coupling to readout PCB 306 and/or SiPM 311.

Optionally, detector module 102a may include a variety of components adapted to facilitate operation of and electrical access to SiPM 311. For example, detector module 102a may include an optical guide disposed between SiPM 311 and sensor 304 and/or reflector 303 to guide photons generated within sensor/scintillator 304 (e.g., scintillator photons) to an interfacing surface of SiPM 311. In various embodiments, the optical guide may be adapted to compensate for surface mismatch between sensor 304 and SiPM 311, and reflector 107 may be adapted to reflect photons towards SiPM 311. In some embodiments, detector module 102a may include an LED (e.g., electrically coupled to readout PCB 306) positioned to illuminate at least a portion of sensor 304 and/or photomultiplier 311, so as to provide a known calibration illumination to photomultiplier 311 to allow for calibration of various elements of embodiments of detector module 102 (e.g., including detector module 102a) and/or radiation detector 101.

In embodiments where sensor 304 is implemented as a scintillator, various scintillator materials may be used, such as NaI(Tl), CsI(Tl), LaBr$_3$(Ce), SrI$_2$(Eu), BGO, PVT, ZnS (Ag), Cs$_2$LiYCl$_6$:Ce (CLYC), CLLB, CLLBC, CeBr$_3$(Ce), any of the aluminum garnet scintillator types (e.g., YAG, LuAG, GAG, GYGAG, etc., which are referred to collectively as xAG), various alkali halides, $^6$LiI(Eu) (which may be embedded within an optical fiber), and/or other scintillator material. In embodiments where sensor 304 is implemented as a semiconductor sensor (e.g., and SiPM 311 is replaced with other non-optical readout electronics, such as low noise amplifiers and/or other readout electronics), various semiconductor materials may be used, such as CZT and/or TlBr. More generally, sensor 304 may be implemented with one or multiple materials, which may be sensitive to various different types of radiation, including gamma and neutron radiation. In further embodiments, sensor may be implemented with a gas proportional sensor and/or a Geiger-Muller counter/sensor. Moreover, where sensor 304 is implemented as a scintillator, SiPM 311 may be replaced with any photomultiplier device, including one or more photomultiplier tubes disposed between sensor 304 and readout PCB 306 and/or configured to operate and/or interconnect similar to SiPM 311, as described herein.

Damping inserts 301, 305, and/or 308 may be formed from rubber, foam, aerogel, and/or other damping materials configured to provide physical shock absorption and/or thermal insulation between enclosure 302 and sensor 304, SiPM 311, and/or readout PCB 306. In some embodiments, damping inserts 301, 305, and/or 308 may be omitted from the interior of detector module 102a and replaced with exterior damping panels disposed about detector module 102a and/or between detector module 102a and radiation detector 101. Readout PCB 306 may be formed from fiberglass and/or other relatively rigid material configured to physically support SiPM 311 and/or provide electrical interconnection between SiPM 311 and readout interface 318, which may be disposed on opposing sides of readout PCB 306. In various embodiments readout PCB 306 may be formed from material that is relatively resistant to degassing when thermally cycled. Flexible cable 307 may be a ribbon cable and/or other flexible cable configured to electrically couple interfaces 316 and 318 yet damp or block transmission of physical shock and/or thermal gradients to readout PCB 306. In various embodiments, flexible cable 307 may include multiple conductors and coaxial cables insulated from one another and configured to provide a low noise signal path for analog and/or digital signals (e.g., detector event signals, power signals, control signals) between interfaces 316 and 318.

In some embodiments, cap 309 may be formed from a rigid material similar to that used to form readout PCB 306. In other embodiments, cap 309 may be formed predominately from a plate of metallic material (e.g., similar to that used to form metal enclosure 302) with multiple coaxial vias (e.g., vias substantially filled with an insulating material and a center conductor insulated from the rest of cap 309 by the insulating material) configured to electrically couple external interface 314 to internal interface 316. In various embodiments, cap 309, interfaces 314 and 316, and/or corresponding vias, insulating materials, and/or conductive traces may be configured to help hermetically seal an internal portion of detector module 102a from the outer environment.

Figure 4A:
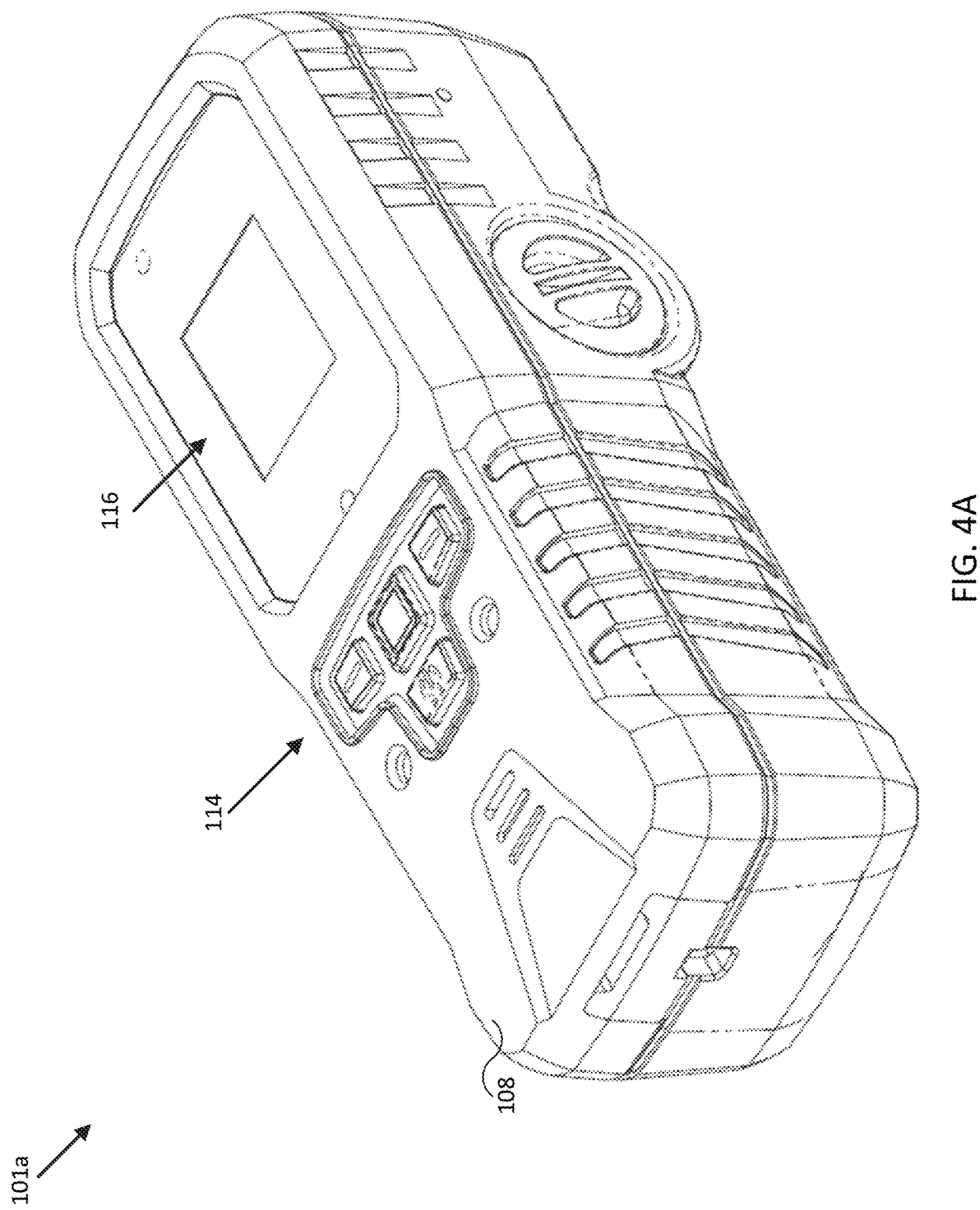
FIG. 4A illustrates a perspective view of a radiation detection system in accordance with an embodiment of the disclosure.
Figure 4B:
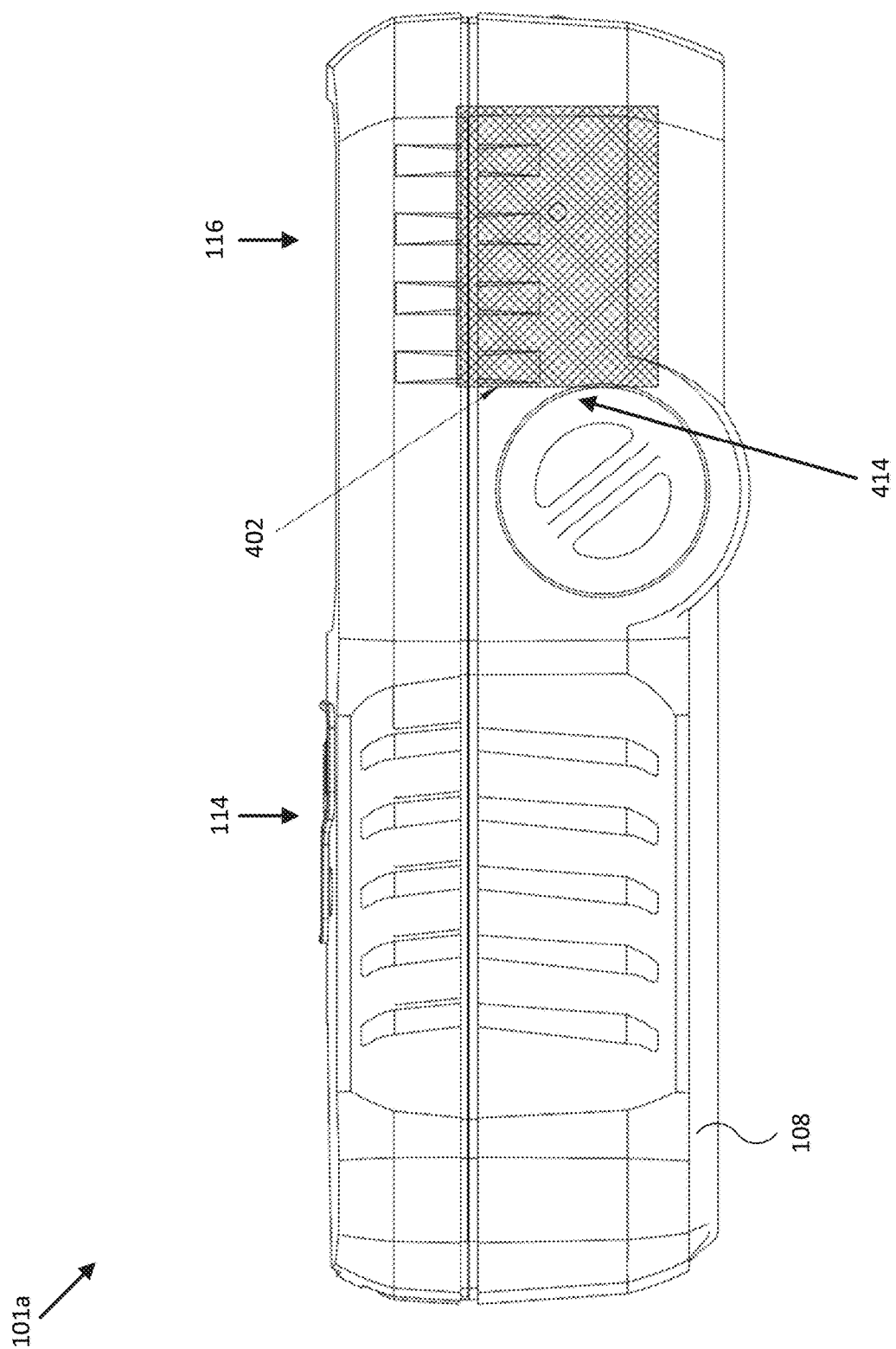
FIG. 4B illustrates a side view of a radiation detection system in accordance with an embodiment of the disclosure.

FIG. 4A illustrates a perspective view of a radiation detection system 101a in accordance with an embodiment of the disclosure. In particular, radiation detection system 101a may be implemented as a spectroscopic personal radiation detector (SPRD). In the embodiments shown in FIG. 4A, radiation detection system 101a includes rugged housing 108, user interface 114 (e.g., including various buttons), and display 116. FIG. 4B illustrates a side view of radiation detection system 101a in accordance with an embodiment of the disclosure. In FIG. 4B, hatched box 402 indicates a general placement of an embodiment of detector module 102a within radiation detection system 101a.

In various embodiments, detector module 102a may be removable and/or replaceable, for example, and be engaged/disengaged (e.g., using interface 314) with/from radiation detection system 101a by opening housing 108 and removing/inserting detector module 102a into recess 402 and engaging interface 314 with a corresponding interface within housing 108 (e.g., generally indicated as interface 414 of radiation detection system 101a). In some embodiments, detector module 102a may be engaged/disengaged with/from radiation detection system 101a by sliding detector module 102a into or out of a slot or recess formed in housing 108 and accessible without opening housing 108. As such, detector module 102a may be configured to physically and/or electrically couple to or within radiation detection system 101a using external interface 314 of detector module 102a and corresponding interface 414 of radiation detection system 101a. In some embodiments, interfaces 314 and 414 may form a male/female interface pair.

Figure 5:
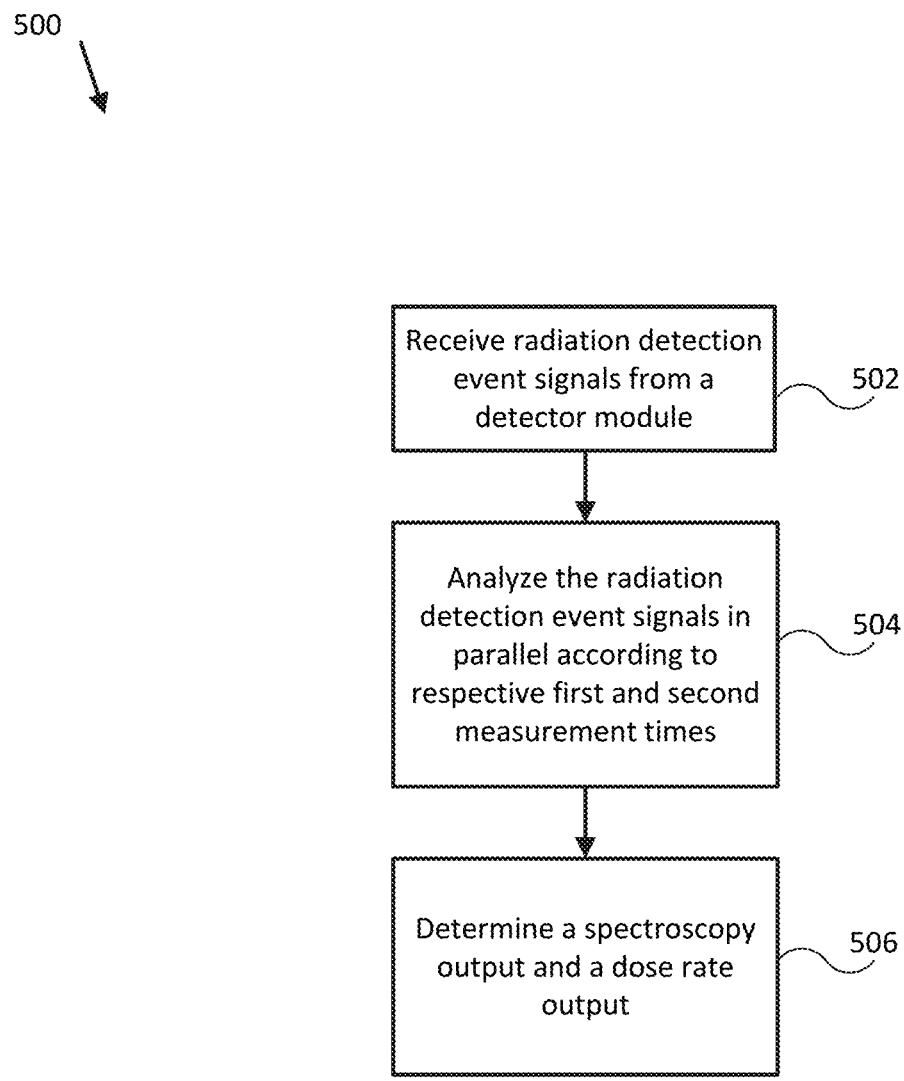
FIG. 5 illustrates a flow diagram of various operations to provide substantially simultaneous spectroscopy and dose rate outputs in accordance with an embodiment of the disclosure.

FIG. 5 illustrates a flow diagram of process 500 to provide spectroscopy data and/or dose rate data in accordance with an embodiment of the disclosure. In some embodiments, the operations of FIG. 5 may be implemented as software instructions executed by one or more logic devices used to implement a radiation detection system. More generally, the operations of FIG. 5 may be implemented with any combination of software instructions, electronic hardware (e.g., inductors, capacitors, amplifiers, or other analog and/or digital components), and/or mechanical hardware used with a radiation detection system. It should be appreciated that any step, sub-step, sub-process, or block of process 500 may be performed in an order or arrangement different from the embodiment illustrated by FIG. 5. Although process 500 is described with reference to system 100, process 500 may be performed according to systems different from system 100 and including a different selection and/or number of modules and/or components.

In block 502, radiation detection event signals from a detector module are received. For example, parallel signal analyzer 140 of system 100 may be configured to receive radiation detection event signals from detector module 102 that correspond to incident ionizing radiation in detector module 102. In some embodiments, parallel signal analyzer 140 may be adapted to receive radiation detection event signals from multiple different detector modules 102. In other embodiments, parallel signal analyzer 140 and/or controller 110 may be configured to determine a count rate and/or an instrumental dead time from the radiation detection event signals. In such embodiments, parallel signal analyzer 140 and/or controller 110 may be configured to compare the count rate and/or the instrumental dead time to a preset threshold (e.g., provided by a user through user interface 114) and adjust or decrease measurement times to reduce the instrumental dead time.

In block 504, radiation detection event signals are analyzed according to respective first and second measurement times. For example, parallel signal analyzer 140 may be configured to analyze the radiation detection event signals received in block 502 in parallel in first and second analysis channels 241 and 242 according to respective first and second measurement times. Such analysis may provide corresponding radiation detection event energies. In some embodiments, parallel signal analyzer 140 may be configured to analyze the radiation detection event signals according to three or more different measurement times, for example, to help select a particular measurement time or to help calibrate and/or stabilize operation of radiation detector 101.

In block 506, a spectroscopy output and a dose rate output are determined. For example, parallel signal analyzer 140 may be configured to determine a spectroscopy output and a dose rate output based on radiation detection event energies determined according to the respective first and second measurement times referenced in block 504. In some embodiments, where the second measurement time is smaller than the first measurement time (e.g., to reduce instrumental dead time of the second analysis channel), parallel signal analyzer 140 may be configured to detect radiation detection events that are analyzed by both the first and second analysis channels, coincidentally, and use the energy determined by the first analysis channel (e.g., the spectroscopy analysis channel) to calibrate or otherwise adjust the analysis performed by the second analysis channel (e.g., the dose rate analysis channel), which can in some cases compensate for a reduced measurement time for the second analysis channel.

By providing simultaneous spectroscopy and dose rate outputs, embodiments of the present disclosure offer a substantially faster, more reliable, and safer to use radiation detector, particularly in the context of highly radiative environments, where reliability and measurement speed are paramount.

Figure 6:
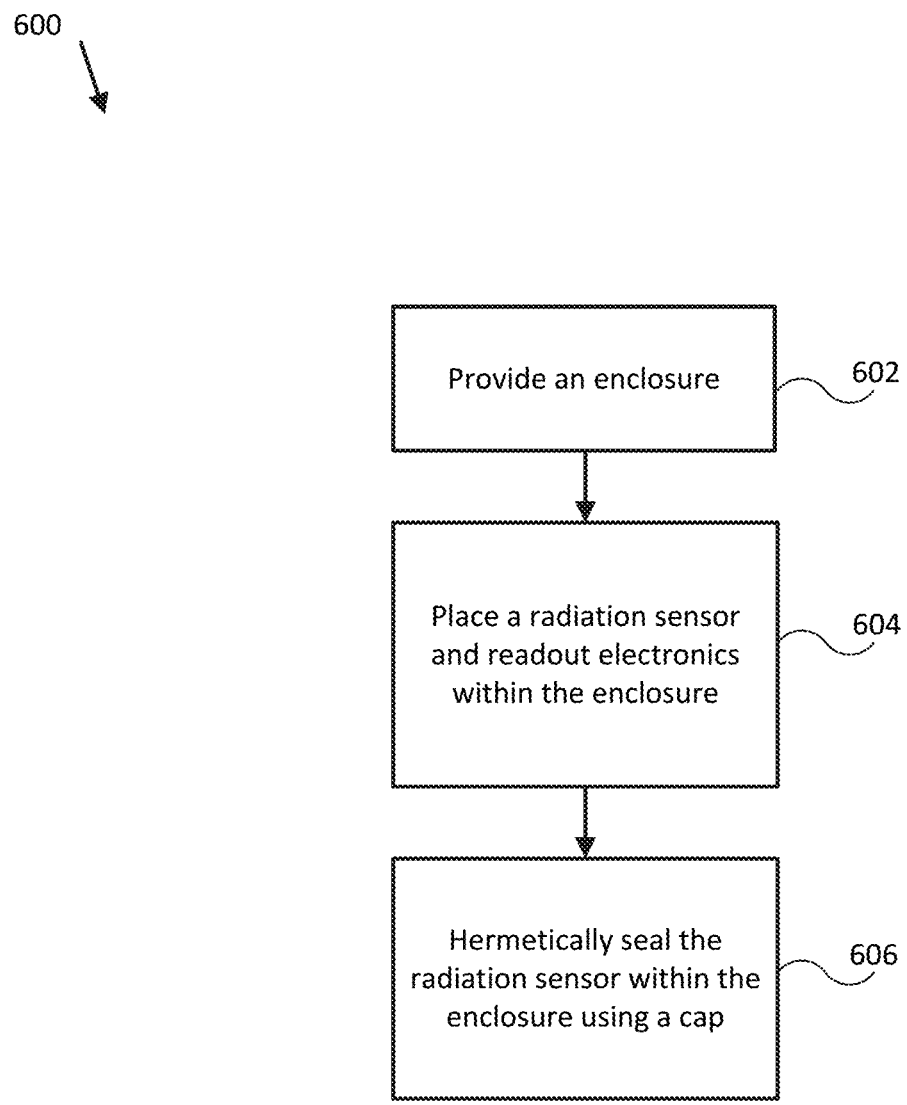
FIG. 6 illustrates a flow diagram of various operations to provide a radiation detector module in accordance with an embodiment of the disclosure.

FIG. 6 illustrates a flow diagram of process 600 to provide spectroscopy data and/or dose rate data in accordance with an embodiment of the disclosure. In some embodiments, the operations of FIG. 6 may be implemented as software instructions executed by one or more logic devices used to implement a radiation detection system. More generally, the operations of FIG. 6 may be implemented with any combination of software instructions, electronic hardware (e.g., inductors, capacitors, amplifiers, or other analog and/or digital components), and/or mechanical hardware used with a radiation detection system. It should be appreciated that any step, sub-step, sub-process, or block of process 600 may be performed in an order or arrangement different from the embodiment illustrated by FIG. 6. Although process 600 is described with reference to detector module 102, process 600 may be performed according to systems different from detector module 102 and including a different selection and/or number of modules and/or components.

In block 602, an enclosure is provided. For example, in some embodiments, a metalized and/or tin plated enclosure 302 may be provided to form an enclosure for detector module 102. In block 604, a radiation sensor and readout electronics are placed within the enclosure provided in block 602. For example, sensor 304 and SiPM 311 and readout PCB 306 may be placed within enclosure 302, where sensor 304 is separated from the enclosure by one or more of damping inserts 301, 305, and/or 308, and where SiPM 311 and/or readout PCB 306 are configured to provide radiation detection event signals 104/132 corresponding to incident ionizing radiation in the sensor 304. In block 606, a radiation sensor is sealed within the enclosure provided in block 602 using a cap. For example, sensor 304, SiPM 311, and/or readout PCB 306 may be hermetically sealed within enclosure 302 using cap 309 to form radiation detector module 102a, where cap 309 includes internal interface 316 configured to couple to readout PCB 306 and/or SiPM 311 and external interface 314 configured to couple to radiation detection system 101a.

By providing a well-insulated and metallically hermetically sealed detector module, embodiments of the present disclosure offer a substantially more rugged and cost effective detector module that can be used in extreme environments over a much longer product lifespan as compared to conventional detector modules.

As explained herein, NaI(Tl) scintillator crystals are often used in gamma radiation detection applications; the crystals are cost effective to manufacture in a wide variety of sizes and shapes, and they offer sufficient energy resolution (FWHM <7% @ 662 keV for 2"×2" detector crystals) and relatively fast light decay time (250 ns), which makes such crystals suitable for many Chemical, Biological, Radiological, Nuclear, and Explosive materials (CBRNE) applications, including handheld radionuclide identification device (RID) instrumentation. However, NaI(Tl) crystals are also hygroscopic and therefore must be protected from environmental/ambient moisture in order to maintain acceptable performance parameters. RIDs have lifetimes greater than 10 years, but scintillator crystal-based detector modules may last less than 2 years if not protected against ambient moisture sufficiently. Moreover, scintillator crystal-based detector modules can benefit from larger crystals, which in turn benefit from mechanically stable enclosures that can support the additional volume/weight of detector modules incorporating such larger crystals and accompanying electronics and/or other similar elements of detector module 102a of FIGS. 3A-B.

Figure 7:
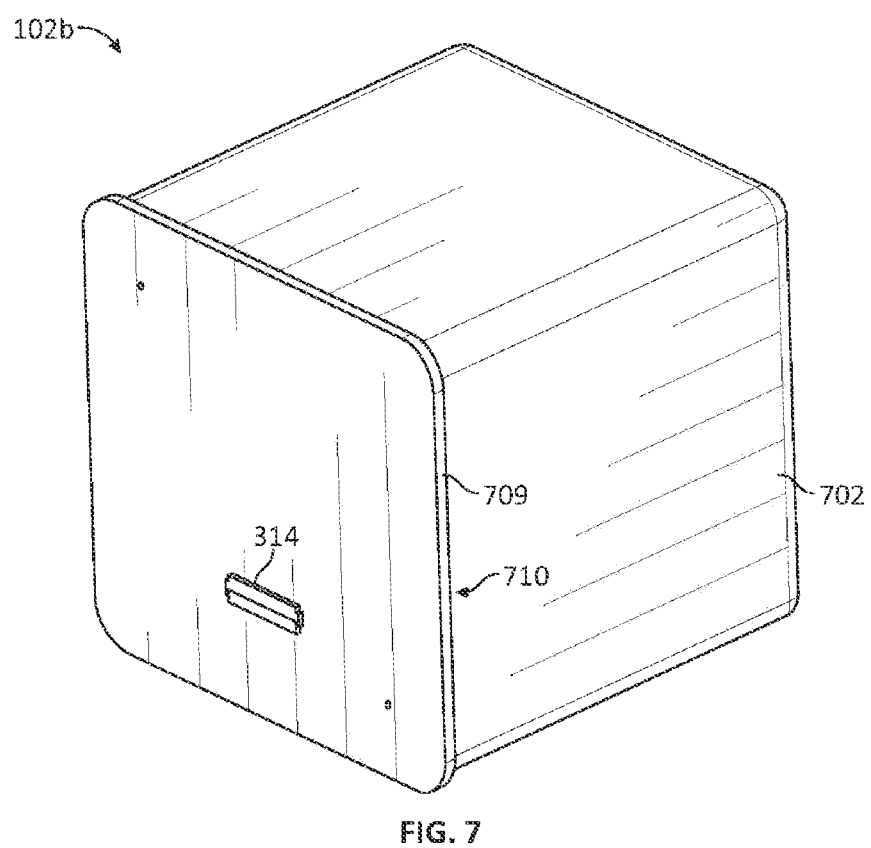
FIG. 7 illustrates a perspective view of a detector module for a radiation detection system in accordance with an embodiment of the disclosure.

FIG. 7 illustrates a perspective view of an embodiment of detector module 102b for a radiation detection system in accordance with an embodiment of the disclosure. In particular, the embodiment shown in FIG. 7 provides a solution to the problem of hermetically sealing a hygroscopic material (e.g., a variety of different types of scintillator and/or semiconductor sensor materials) in a relatively inexpensive, easy to manufacture, ruggedized housing that omits conventional silicone sealants that otherwise outgas and degrade sensor materials, and that generally deteriorate over time.

For example, as shown in FIG. 7, detector module 102b includes a metal to edge plated cap printed circuit board (PCB) hermetic seal (e.g., generally shown as solder joint 710) that is formed by soldering a metal enclosure/housing 702 to an edge plated cap PCB 709 that may include a milled slot formed adjacent a perimeter thereof that is configured to facilitate formation of hermetic seal/solder joint 710 and to facilitate temperature equalization across the PCB and/or between the PCB and the metal enclosure. In alternative embodiments, a mesa slot (e.g., where the base of the slot is disposed substantially equal with or above a top metal surface of edge plated cap PCB 709) with similar hermetic sealing and temperature equalization characteristics may be formed (e.g., from a metal, metalized material, or metal-plateable material, such as alumina or alumina-based materials, which may be additively manufactured/3D printed or otherwise formed or deposited on and/or adhered to a surface of edge plated cap PCB 709) adjacent the perimeter of edge plated cap PCB 709.

Metal enclosure/housing 702 may be formed by deep drawing a pliable metal, such as a single piece of aluminum, to form a relatively thin-walled (e.g., approximately 2 mil thick, and therefore light weight) enclosure. Metal enclosure/housing 702 may be tin plated and/or tinned with solder (e.g., any solder material or technique, including a 99C lead free solder alloy—with a relatively low melting point to allow for reflow of the hermetic seal without reflowing other interconnects and/or otherwise damaging components of detector module 102b, such as by thermal stress) at least in the area where metal enclosure/housing 702 joins to edge plated cap PCB 709 to form hermetic seal/solder joint 710. Edge plated cap PCB 709 may include various conductive via structures formed therethrough that couple multi-conductor interfaces/connector 314 to cap 709, for example, and detector module 102b may otherwise include elements similar to those of detector module 102a shown in FIGS. 3A-B, as described herein.

FIGS. 8A-B illustrate cross sectional views of edge plated cap PCB 709 in accordance with embodiments of the disclosure. In FIG. 8A (not drawn isometrically or to scale), edge plated cap PCB 709 includes a laminate core/dielectric layer/substrate 860 disposed between upper and lower metal layers 862 and 863 to generally form a two layer PCB. In general, laminate core/dielectric layer/substrate 860 may be formed from any PCB core material, for example, but should be formed from a core material that is typically less moisture permeable and/or hygroscopic than conventional FR-4 core material, such as 96-98% Alumina (Al2O3) and/or Rogers 4350B (RO4350B) and/or Isola FR408HR laminates. Upper and lower metal layers 862 and 863 may be formed from copper, aluminum, and/or other conductive metals and/or alloys, for example, and may be between 1 and 2 mils thick (e.g., such that the combined thickness is equal to or greater than 2 mils) and be configured to form the primary vapor barrier for detector module 102b, supplemented by laminate core/dielectric layer/substrate 860 and additional material layers, as shown and described with respect to at least FIGS. 8A-B. For example, upper and lower metal layers 862 and 863 may be configured to shield, trap, and slow water vapor transit through dielectric substrate 860 to the interior of detector module 102b.

As shown in FIG. 8A, edge plated cap PCB 709 may include a controlled depth milled slot 880 formed in and/or through upper metal layer 862 and/or dielectric substrate 860, for example, and/or adjacent a planar perimeter of edge plated cap PCB 709 (e.g., adjacent a perimeter edge of edge plated cap PCB 709). Milled slot 880 may be configured to mate with the open edge of metal enclosure/housing 702 and form a robust mechanical, slip-free join with metal enclosure/housing 702 via hermetic seal/solder joint 710. In various embodiments, a plated metal layer may be formed within milled slot 880, for example, and over upper and lower metal layers 862 and 863 and/or along planar edges of edge plated cap PCB 709 to form upper and lower plated metal layers 866 and 868 and plated edges 864. Such plated metal layer may be copper, for example, or any other plateable and solderable metal or alloy. In specific embodiments, the combined thickness of upper metal layer 862 and upper plated metal layer 866 may be approximately 1.4 mils, and the combined thickness of lower metal layer 863 and lower plated metal layer 868 may also be approximately 1.4 mils.

In alternative embodiments, milled slot 880 may be replaced with a mesa slot of similar depth and lateral placement about a perimeter of edge plated cap PCB 709, but formed without control depth milling into or through upper metal layer 862 and/or dielectric substrate 860. For example, in one embodiment, a single perimeter mesa may be formed about a perimeter of edge plated cap PCB 709 and on upper metal layer 862, with sufficient height and width to allow a slot similar in depth and width to milled slot 880 to be formed within the single perimeter mesa, such as by control depth milling and/or patterned etching substantially above upper metal layer 862 and/or dielectric substrate 860, or milling and/or etching only partially into upper metal layer 862. In another embodiment, the slot within the single perimeter mesa may be formed as the single perimeter mesa is deposited and/or otherwise formed or built-up on upper metal layer 862. In a further embodiment, two concentric perimeter mesas may be formed about a perimeter of edge plated cap PCB 709 and on upper metal layer 862, with sufficient height and concentric displacement to form a slot (similar in depth and width to milled slot 880) between the two concentric perimeter mesas, such that the base of the resulting mesa slot is substantially formed by upper metal layer 862 and/or plated metal layer 866.

Single or multiple perimeter mesas may be formed by additive manufacture/3D printing onto upper metal layer 862 and/or plated metal layer 866, for example, or otherwise formed or deposited on and/or adhered to upper metal layer 862 and/or plated metal layer 866. In various embodiments, each perimeter mesa may be formed from a metal, a metalized material, or a metal-plateable material, such as alumina or alumina-based materials, for example, and the height of each perimeter mesa may be between approximately 1 mm and 2 mm, inclusive, or may be between approximately 0.5 and 2 mm, inclusive.

In some embodiments, upper and lower plated metal layers 866 and 868, plated edges 864, milled slots 880, and/or various other or all exposed surfaces of edge plated cap PCB 709 may be hot air solder leveling (HASL) finished (e.g., using any solder material or technique, including 99C lead free solder), for example, may be immersion-silver (IAg) plated/finished (e.g., to provide relatively flat, co-planar solderable surfaces, relative to other finishes, including HASL finishing), may be electroless nickel immersion gold (ENIG) or electroless nickel electroless palladium immersion gold (ENEPIG) finished (e.g., to avoid risk of oxidation), and/or may be finished using any similar technique(s) so as to reduce exposure of dielectric substrate 860 to the environment.

In various embodiments, a black solder mask may be applied and/or patterned over upper and/or lower metal layers 862 and 863 (e.g., over upper and/or lower plated metal layers 866 and 868) to form upper and lower protective layers 870 and 872 to help block light from transiting through edge plated cap PCB 709 and into readout circuitry disposed within metal enclosure/housing 702 of detector module 102*b*. Edge plated cap PCB 709 may include one or more via structures 890 formed therethrough so as to facilitate electrical coupling of interfaces (e.g., interfaces 314 and 316) to and/or through edge plated cap PCB 709, as described herein.

For example, FIG. 8B illustrates a detailed view of one such via structure 890, in accordance with an embodiment of the disclosure. As shown in FIG. 8B (not drawn isometrically or to scale), via structure 890 may be implemented by a cylindrical hole 892 formed, patterned, and/or drilled through dielectric substrate 860 and upper and lower metal layers 862 and 863 that is plated (e.g., similar to plated metal layers 866 and 868) to form cylindrical plated metal conductor 894. Cylindrical conductor 894 may be electrically coupled to patterned portions of upper and lower metal layers 862 and 863 and plated metal layers 866 and 869, which may be patterned to form upper and lower component pads 893 (e.g., surface mount pads on which to solder circuit elements, including interfaces 314 and 316) and/or accompanying traces. In alternative embodiments, via structure 890 may lack one or both such component pads 893, for example, such that the patterned portions of upper and lower metal layers 862 and 863 and plated metal layers 866 and 869 form traces routed to component pads placed elsewhere on edge plated cap PCB 709.

In various embodiments, cylindrical hole 892 of via structure 890 may be filled with epoxy to form via plug 896 (e.g., to help hermetically seal an interior of metal enclosure/housing 702 against moisture, light, and/or other operational contaminate). Via structure 890 may also include reflowed solder layers 898 formed over component pads 893 and/or via plug 896 to help reduce exposure of via structure 890 to the environment and facilitate joining to electrical components, as described herein. In some embodiments, upper and lower protective layers 870 and 872 may be formed directly over upper and lower component pads 893, for example, or over portions of upper and lower component pads 893 and/or reflowed solder layers 898.

In general, an etched moat may be formed about each component pad 893 of via structure 890 and/or about associated traces patterned from upper and/or lower metal layers 862 and 863 and upper and/or lower plated metal layers 866 and 868, so as to electrically isolate via structures 890 and/or their associated traces from the rest of edge plated cap PCB 709 and/or conductive elements soldered to edge plated cap PCB 709, including metal enclosure/housing 702. Wherever possible, traces and/or other features patterned from lower metal layer 863 may be routed under substantially contiguous portions of upper metal layer 862 so that ambient light incident within a trough formed about such features and/or associated traces must generally pass through at least upper and lower protective layers (black solder mask layers) 870 and 872 and at least one of upper or lower metal layers 862 and 863 before being able to enter an interior of detector module 102*b*. Alternatively, other unrelated features, such as vent holes, may be formed so as to be easily plugged by reflowed solder, as described herein. In specific embodiments, via structures 890 and/or accompanying circuit components may be staggered when formed in or placed on edge plated cap PCB 709 and/or include features configured to minimize light and/or moisture transit therethrough. Component soldering, HASL, IAg, ENIG, and/or ENEPIG finishing/plating, and/or other reflowed solder finishing and/or processing, as described herein, may occur during a single reflow process or multiple reflow processes.

Once formed and populated with electrical components and/or other elements of detector module 102*b*, edge plated cap PCB 709 may be soldered (e.g., using any solder material or technique, including 99C lead free solder) to metal enclosure/housing 702 to form hermetic seal/solder joint 710. In some embodiments, such process may include preheating edge plated cap PCB 709, metal enclosure/housing 702, and accompanying elements of detector module 102*b* to facilitate forming hermetic seal/solder joint 710. Metal vent holes formed through edge plated cap PCB 709 (e.g., formed similar to via structure 890) may be provided to allow hot air to escape metal enclosure/housing 702 while forming hermetic seal/solder joint 710 and/or to allow the interior of detector module 102*b* to be purged with an inert gas (e.g., inert with respect to the functioning and longevity of detector module 102*b*), such as Argon. Such vent holes may be sealed by solder to complete hermetically sealing the interior of detector module 102*b* from moisture ingress.

In various embodiments, upper and/or lower metal layers 862 and/or 863 of edge plated cap PCB 709 may form ground planes (e.g., similar to ground plane 312 of cap 309) that are electrically coupled to metal enclosure/housing 702 through milled (and plated) slot 880 of edge plated cap PCB 709 and that can span substantially the entire planar extent of edge plated cap PCB 709 (e.g., except for via structures 890 and/or related traces). In such embodiments, upper and/or lower metal layers 862 and/or 863 may be configured to provide substantially equalized thermal expansion of edge plated cap PCB 709 with hermetic seal 710 and enclosure 702, thereby enabling detector module 102*b* to maintain a reliable hermetic seal over many more temperature cycles than conventional silicone to metal or glass hermetic seals. In alternative embodiments, such ground planes may be electrically coupled to metal enclosure/housing 702 through mesa slotted embodiments of edge plated cap PCB 709, as described herein.

Figure 9A:
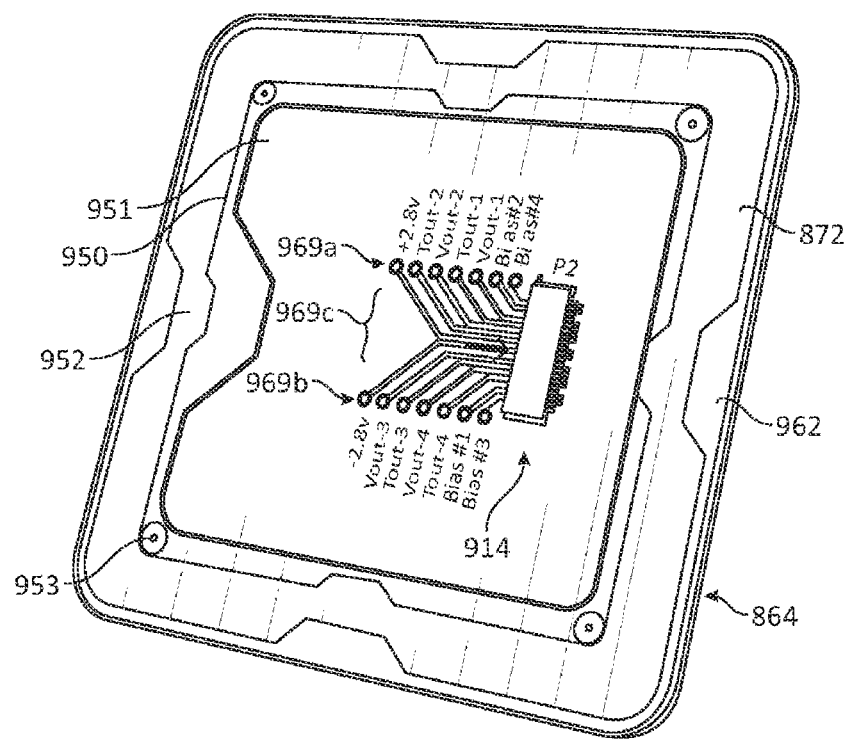
FIG. 9A illustrates a perspective view of an external surface of a cap for a detector module in accordance with an embodiment of the disclosure.

FIG. 9A illustrates a perspective view of an external surface of edge plated cap PCB 709 for detector module 102*b* in accordance with an embodiment of the disclosure. In FIG. 9A, the external surface of edge plated cap PCB 709 includes an isolation trench 950 formed through lower metal layer 863 and lower plated metal layer 868 to a lower surface of dielectric substrate 860 and configured to electrically separate and/or isolate a lower ground plane 951 from a lower shield plane 952 of edge plated cap PCB 709. In general, isolation trench 950 may be formed by lithography and/or patterned etching of lower metal layer 863 and lower plated metal layer 868, and each of lower ground plane 951 and lower shield plane 952 may be formed from portions of lower metal layer 863 and/or lower plated metal layer 868. Lower protective layer/solder mask 872 may be formed substantially over lower ground plane 951, in isolation trench 950, and over portions of lower shield plane 952, so as to leave unprotected/unmasked portion 962 of lower shield plane 952 disposed generally along a lower perimeter of edge plated cap PCB 709 and/or adjoining (and/or electrically coupled to) plated metal edge 864.

In the embodiment shown in FIG. 9A, one or more of an external interface header/solder pad/contact array 914, test contacts 969 *a-b*, traces 969*c* electrically coupling test contacts 969*a-b* to external interface solder pad array 914, and/or ground plane contacts 953 may be formed or patterned from and/or within lower ground plane 951 (e.g., with various etched moats formed around such elements for electrical isolation, as needed). In various embodiments, one or more of ground plane contacts 953 may be implemented as relatively large circular solder pads incorporating screw holes, other mechanical retainer mechanisms, and/or solderable vent holes formed through edge plated cap PCB 709 and sealable by application of solder across ground plane contacts 953. In some embodiments, unprotected/unmasked portion 962 of lower shield plane 952 and/or lower ground plane contacts 953 may be used as tinned (e.g., HASL, IAg, ENIG, and/or ENEPIG finished/plated) surfaces configured to electrically and/or mechanically couple to other elements of a device incorporating detector module 102*b*, such as radiation detector 101 and/or radiation detection system 101*a* of FIGS. 1 and 4A-B.

Figure 9B:
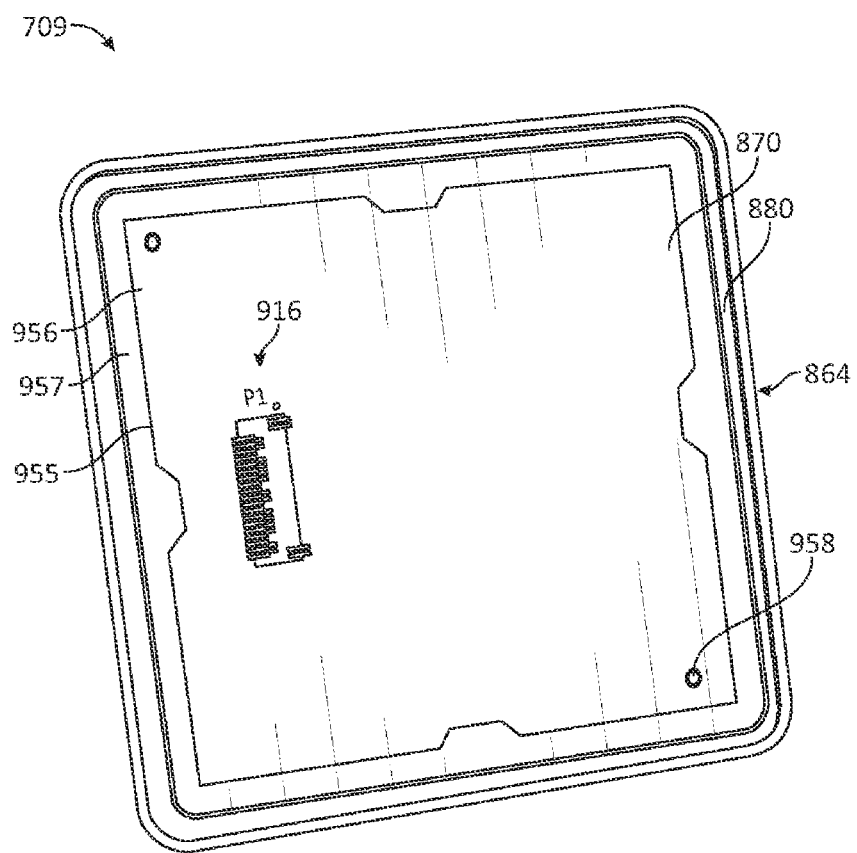
FIG. 9B illustrates a perspective view of an internal surface of a cap for a detector module in accordance with an embodiment of the disclosure.

FIG. 9B illustrates a perspective view an internal surface of edge plated cap PCB 709 for detector module 102*b* in accordance with an embodiment of the disclosure. In FIG. 9B, the internal surface of edge plated cap PCB 709 includes an isolation trench 955 formed through upper metal layer 862 and upper plated metal layer 866 to an upper surface of dielectric substrate 860 and configured to electrically separate and/or isolate an upper ground plane 956 from an upper shield plane 957 of edge plated cap PCB 709. In general, isolation trench 955 may be formed by lithography and/or patterned etching of upper metal layer 862 and upper plated metal layer 866, and each of upper ground plane 956 and upper shield plane 957 may be formed from portions of upper metal layer 862 and/or upper plated metal layer 866. Upper protective layer/black solder mask 870 may be formed substantially over upper ground plane 956, in isolation trench 955, and over portions of upper shield plane 957, so as to leave milled slot 880 and/or an alternative mesa slot (e.g., disposed generally along an upper perimeter of edge plated cap PCB 709) uncovered, solderable, and/or adjoining (and/or electrically coupled to) plated metal edge 864.

In the embodiment shown in FIG. 9B, one or more of an internal interface header/solder pad/contact array 916 and/or ground plane contacts 958 may be formed or patterned from and/or within upper ground plane 956 (e.g., with various etched moats formed around such elements for electrical isolation, as needed). In various embodiments, one or more of ground plane contacts 958 may be implemented as relatively large circular solder pads, screw holes, other mechanical retainer mechanisms, and/or internal vent holes formed through edge plated cap PCB 709 and sealable (on an opposing end) by application of solder (e.g., across ground plane contacts 953). In some embodiments, upper ground plane contacts 958 may be used as tinned (e.g., HASL, IAg, ENIG, and/or ENEPIG finished/plated) surfaces configured to electrically and/or mechanically couple to other elements inside detector module 102*b*, similar to those shown in FIGS. 3A-B.

Figure 10A:
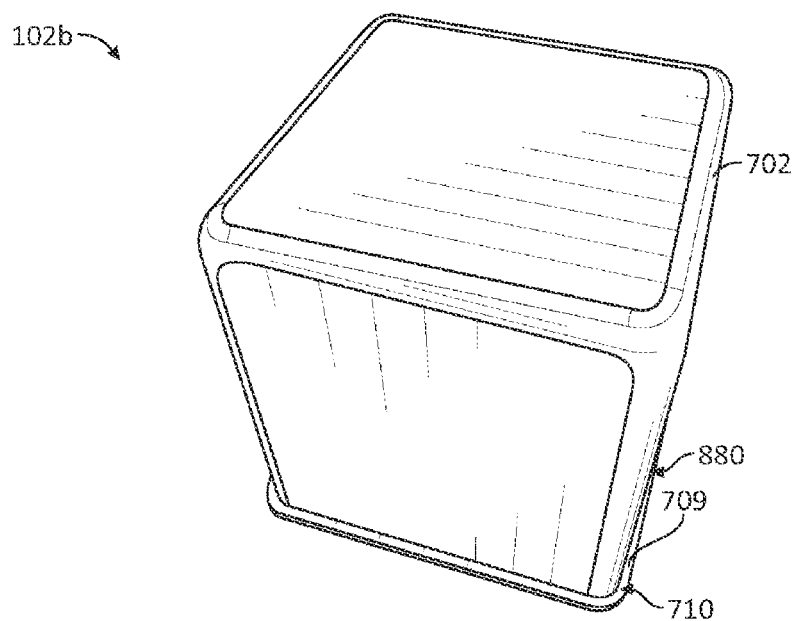
FIGS. 10A-B illustrate perspective views of an assembled detector module for a radiation detector in accordance with an embodiment of the disclosure.
Figure 10B:
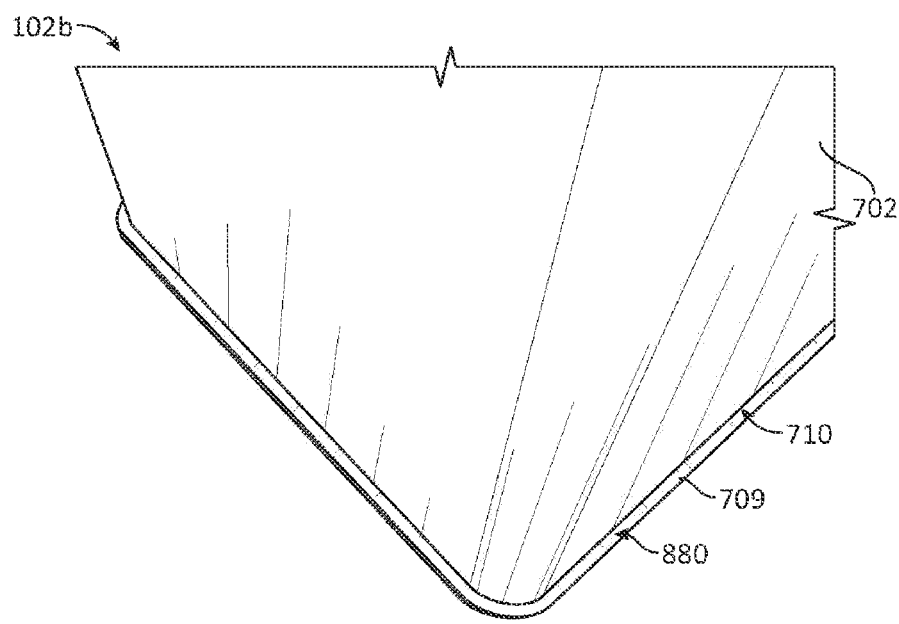

FIGS. 10A-B illustrate perspective views of an assembled detector module 102*b* for radiation detector 101 and/or radiation detection system 101*a* in accordance with an embodiment of the disclosure. In FIG. 10A, metal enclosure/housing 702 is shown soldered to milled slot 880 of edge plated cap PCB 709 to form hermetic seal/solder joint 710. FIG. 10B shows a close-up view of a similar embodiment with metal enclosure/housing 702 soldered to milled slot 880 of edge plated cap PCB 709 to form hermetic seal/solder joint 710.

Figure 11:
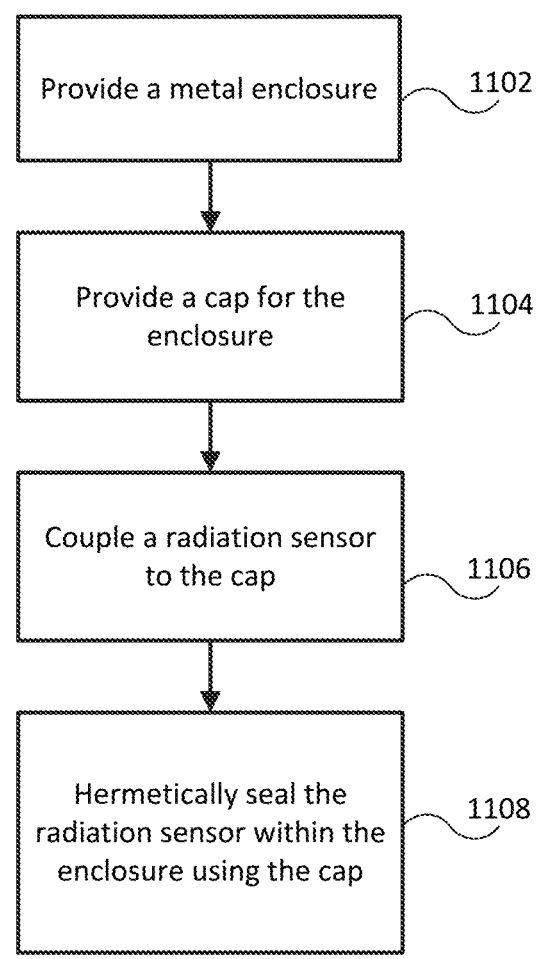
FIG. 11 illustrates a flow diagram of various operations to provide a radiation detector module in accordance with an embodiment of the disclosure.

FIG. 11 illustrates a flow diagram of process 1100 to provide a radiation detector module (e.g., radiation detector module 102, 102*a*, and/or 102*b*) in accordance with an embodiment of the disclosure. In some embodiments, the operations of FIG. 11 may be implemented as software instructions executed by one or more logic devices used to implement a radiation detection system. More generally, the operations of FIG. 11 may be implemented with any combination of software instructions, electronic hardware (e.g., inductors, capacitors, amplifiers, or other analog and/or digital components), and/or mechanical hardware used with a radiation detection system. It should be appreciated that any step, sub-step, sub-process, or block of process 1100 may be performed in an order or arrangement different from the embodiment illustrated by FIG. 11. Although process 1100 is described with reference to detector module 102, process 1100 may be performed according to systems different from detector module 102 and including a different selection and/or number of modules and/or components.

In block 1102, a metal enclosure is provided. For example, a metal and/or tin plated/metalized enclosure may be provided to form metal enclosure/housing 702 for detector module 102b. In some embodiments, a single piece of metal or alloy may be deep drawn to form a relatively thin-walled cuboidal or cylindrical metal enclosure with a roughly rectangular, square, circular, or elliptical open surface and corresponding planar edge configured to mate with a similarly shaped milled slot formed adjacent or adjoining an upper perimeter of a corresponding cap (e.g., edge plated cap PCB 709). Once formed, such metal enclosure may be tinned along its open planar edge (e.g., using any solder material or technique, including 99C lead free solder) to facilitate soldering to or within such milled slot to form a hermetic seal/solder joint (e.g., hermetic seal/solder joint 710).

In block 1104, a cap is provided. For example, edge plated cap PCB 709 may be provided that is configured to mate and form hermetic seal/solder joint 710 with metal enclosure/housing 702 provided in block 1102 in order to protect the contents of detector module 102b from ambient moisture and/or light. In some embodiments, a two layer PCB (e.g., including upper metal layer 862, dielectric substrate 860, and lower metal layer 863) may be stamped, press cut, sawed, and/or otherwise shaped to form a rectangular, square, circular, or elliptical disk shaped similar to the open surface of metal enclosure/housing 702 and extending beyond the planar edge of the open surface of metal enclosure/housing 702 (e.g., extending approximately 100-250 mils beyond the perimeter of such planar edge of metal enclosure/housing 702).

Once such two layer PCB is shaped, a rectangular, square, circular, or elliptical controlled depth slot may be formed (e.g., by controlled depth milling, or through mesa formation) about a perimeter of the two layer PCB, where the shape of the slot roughly matches the shape of the planar edge of the open surface of metal enclosure/housing 702. The width and/or depth of the slot may be selected to accommodate the tinned planar edge of metal enclosure/housing 702 and/or sufficient solder to form hermetic seal/solder joint 710. One or more via and/or vent holes may be formed through the two layer PCB prior to, during, or after formation of the slot.

Once the controlled depth slot and via/vent holes are formed in the two layer PCB, a plated metal layer may be formed over upper metal layer 862, lower metal layer 863, over and within controlled depth slot 880, within any via holes, and over any exposed edges or other surfaces of the two layer PCB (e.g., to form plated edges 864). Via structures, solder contacts, traces, ground and shield planes, and/or associated moats, trenches, and/or other structures may be formed in the plated two layer PCB, for example, and upper and lower protective layers/solder masks may be formed over the resulting patterned two layer (plated) PCB to provide edge plated cap PCB 709, as described herein. In various embodiments, exposed metal or plated metal portions of edge plated cap PCB 709 may be tinned (e.g., HASL, IAg, ENIG, and/or ENEPIG finished/plated) prior to coupling various electrical and/or other components to edge plated cap PCB 709.

In block 1106, a radiation sensor is coupled to the cap provided in block 1104. For example, sensor 304 and SiPM 311 and readout PCB 306 may be coupled to an interior surface of edge plated cap PCB 709, where internal interface 316 is soldered to internal interface header/solder pad/contact array 916 and/or various other elements of detector module 102 (e.g., 102a and/or 102b) are soldered or screwed to upper or internal ground plane contacts 958, for example. Also, external interface 314 may be coupled to an exterior surface of edge plated cap PCB 709, where external interface 314 is soldered to external interface header/solder pad/contact array 914 and/or various other elements of detector module 102 (e.g., 102a and/or 102b) are soldered or screwed to external or lower ground plane contacts 953. In some embodiments, components may be placed on solder pads or contacts patterned from lower and upper ground planes 951 and 955 and the partial assembly heated as part of a solder reflow process.

In block 1108, a radiation sensor is sealed within the enclosure provided in block 1102 using the cap provided in block 1104. For example, sensor 304, SiPM 311, and/or readout PCB 306 may be hermetically sealed within enclosure 702 using edge plated cap PCB 709 to form radiation detector module 102 b, where edge plated cap PCB 709 includes internal interface 316 configured to couple to readout PCB 306 and/or SiPM 311 and external interface 314 configured to couple to radiation detection system 101a. In some embodiments, sensor 304 may be separated from metal enclosure 702 by one or more of damping inserts 301, 305, and/or 308, and SiPM 311 and/or readout PCB 306 may be configured to provide radiation detection event signals 104/132 corresponding to incident ionizing radiation in the sensor 304.

In various embodiments, metal enclosure 702 may be soldered to edge plated cap PCB 709 to form hermetic seal/solder joint 710 by heating the cap assembly formed in block 1106 (e.g., edge plated cap PCB 709 and all components coupled thereto), mating slot 880 of edge plated cap PCB 709 to the planar edge of metal enclosure 702, applying solder and localized heat to slot 880 and/or metal enclosure 701, allowing the applied solder to form a bead/hermetic seal/solder joint 710 across the entirety of slot 880, and then allowing the assembly to cool. Vent holes in edge plated cap PCB 709 may be sealed by solder prior to or during cooling, for example, or may be coupled to a gas handling (e.g., delivery and/or evacuating/pumping) system and used to purge an interior of detector module 102b (e.g., with Argon) prior to such sealing.

By providing a well-insulated and metallically hermetically sealed detector module, embodiments of the present disclosure offer a substantially more rugged and cost effective detector module that can be used in extreme environments over a much longer product lifespan as compared to conventional detector modules.

Where applicable, various embodiments provided by the present disclosure can be implemented using hardware, software, or combinations of hardware and software. Also where applicable, the various hardware components and/or software components set forth herein can be combined into composite components comprising software, hardware, and/or both without departing from the spirit of the present disclosure. Where applicable, the various hardware components and/or software components set forth herein can be separated into sub-components comprising software, hardware, or both without departing from the spirit of the present disclosure. In addition, where applicable, it is contemplated that software components can be implemented as hardware components, and vice-versa.

Software in accordance with the present disclosure, such as non-transitory instructions, program code, and/or data, can be stored on one or more non-transitory machine readable mediums. It is also contemplated that software identified herein can be implemented using one or more general purpose or specific purpose computers and/or computer systems, networked and/or otherwise. Where applicable, the ordering of various steps described herein can be changed, combined into composite steps, and/or separated into substeps to provide features described herein.

Embodiments described above illustrate but do not limit the invention. It should also be understood that numerous modifications and variations are possible in accordance with the principles of the invention. Accordingly, the scope of the invention is defined only by the following claims.

What is claimed is:

1. A radiation detector module comprising:
   a metallic and/or metalized enclosure;
   a radiation sensor disposed within the enclosure;
   readout electronics configured to provide radiation detection event signals corresponding to incident ionizing radiation in the radiation sensor; and
   a cap comprising an internal interface configured to couple to the readout electronics and an external interface configured to couple to a radiation detector, wherein the cap is configured to hermetically seal the radiation sensor within the enclosure, and wherein the cap comprises an edge plated printed circuit board (PCB) comprising:
      a slot configured to mate with a planar edge of an open surface of the enclosure, wherein the slot of the cap is soldered to the planar edge of the enclosure to hermetically seal the radiation sensor within the enclosure; and
      a via structure formed through the edge plated PCB and configured to electrically couple the external interface of the cap to the internal interface of the cap.

2. The radiation detector module of claim 1, wherein:
   the edge plated PCB comprises a two layer PCB comprising upper and lower metal layers and a dielectric substrate disposed therebetween; and
   the slot comprises a plated metal slot formed about a perimeter of the edge plated PCB by controlled depth milling of at least the upper metal layer of the two layer PCB.

3. The radiation detector module of claim 2, wherein:
   the two layer PCB comprises an upper shield plane disposed within the upper metal layer of the cap and electrically and thermally coupled to the slot and/or the enclosure to facilitate temperature equalization across the edge plated PCB and/or between the edge plated PCB and the enclosure.

4. The radiation detector module of claim 1, wherein:
   the edge plated PCB comprises a plurality of the via structures; and
   the radiation sensor is separated from the enclosure by one or more damping inserts.

5. The radiation detector module of claim 4, wherein:
   the damping inserts comprise one or more rubber or foam pads disposed around at least a portion of the sensor and the readout electronics and/or between the readout electronics and the cap.

6. The radiation detector module of claim 4, wherein:
   at least one of the damping inserts is disposed substantially across more than half the surface area of a face of the sensor and is configured to provide a thermal barrier to the enclosure and to provide shock absorption.

7. The radiation detector module of claim 1, further comprising:
   a readout printed circuit board (PCB) configured to support the readout electronics, wherein the readout PCB comprises a readout interface; and
   a flexible cable coupled between the readout interface and the internal interface of the cap, wherein the flexible cable is configured to damp and/or block transmission of a mechanical shock and/or a thermal gradient from the cap to the readout interface.

8. The radiation detector module of claim 1, wherein:
   the readout electronics comprises a silicon based photomultiplier coupled to a face of the sensor.

9. The radiation detector module of claim 1, further comprising:
   the radiation detector; and
   a radiation detector housing, wherein the radiation detector module is configured to physically and/or electrically couple to or within the radiation detector housing using the external interface of the cap and a corresponding interface of the radiation detector module.

10. The radiation detector of claim 9, further comprising a logic device and a display, wherein the logic device is configured to:
    determine a spectroscopy output and/or a dose rate output corresponding to the radiation detection event signals provided by the readout electronics of the radiation detector module; and
    display at least a portion of the spectroscopy output and/or the dose rate output using the display.

11. A method comprising:
    providing a metallic and/or metalized enclosure;
    providing a cap comprising an edge plated printed circuit board (PCB) comprising a slot configured to mate with a planar edge of an open surface of the enclosure;
    coupling a radiation sensor and readout electronics to an interior surface of the cap, wherein the readout electronics are configured to provide radiation detection event signals corresponding to incident ionizing radiation in the radiation sensor; and
    hermetically sealing the radiation sensor within the enclosure using the cap to form a radiation detector module, wherein:
       the cap comprises an internal interface configured to couple to the readout electronics and an external interface configured to couple to a radiation detector;
       the hermetically sealing the radiation sensor within the enclosure comprises soldering the slot of the cap to the planar edge of the enclosure to hermetically seal the radiation sensor within the enclosure; and
       the edge plated PCB comprises a via structure formed through the edge plated PCB and configured to electrically couple the external interface of the cap to the internal interface of the cap.

12. The method of claim 11, wherein:
    the edge plated PCB comprises a two layer PCB comprising upper and lower metal layers and a dielectric substrate disposed therebetween; and
    the slot comprises a plated metal slot formed about a perimeter of the edge plated PCB by controlled depth milling of at least the upper metal layer of the two layer PCB.

13. The method of claim 12, wherein:

the two layer PCB comprises an upper shield plane disposed within the upper metal layer of the cap and electrically and thermally coupled to the slot and/or the enclosure to facilitate temperature equalization across the edge plated PCB and/or between the edge plated PCB and the enclosure.

14. The method of claim 11, wherein:

the edge plated PCB comprises a plurality of the via structures; and the radiation sensor is separated from the enclosure by one or more damping inserts.

15. The method of claim 14, wherein:

the damping inserts comprise one or more rubber or foam pads disposed around at least a portion of the sensor and the readout electronics and/or between the readout electronics and the cap.

16. The method of claim 14, wherein:

at least one of the damping inserts is disposed substantially across more than half a surface area of a face of the sensor and is configured to provide a thermal barrier to the enclosure and to provide shock absorption.

17. The method of claim 11, further comprising:

placing a readout printed circuit board (PCB) within the enclosure, wherein the readout PCB is configured to support the readout electronics and comprises a readout interface; and coupling a flexible cable between the readout interface and the internal interface of the cap, wherein the flexible cable is configured to damp and/or block transmission of a mechanical shock and/or a thermal gradient from the cap to the readout interface.

18. The method of claim 11, wherein:

the readout electronics comprises a silicon based photomultiplier coupled to a face of the sensor.

19. The method of claim 11, further comprising:

coupling the radiation detector module to or within a radiation detector housing, wherein the radiation detector module is configured to physically and/or electrically couple to or within the radiation detector housing using the external interface of the cap and a corresponding interface of the radiation detector module.

20. The method of claim 19, further comprising:

determining a spectroscopy output and/or a dose rate output corresponding to the radiation detection event signals provided by the readout electronics of the radiation detector module; and displaying at least a portion of the spectroscopy output and/or the dose rate output using a display.

\* \* \* \* \*

UNITED STATES PATENT AND TRADEMARK OFFICE
CERTIFICATE OF CORRECTION

PATENT NO. : 11,391,851 B2
APPLICATION NO. : 17/019000
DATED : July 19, 2022
INVENTOR(S) : Hartmut Brands et al.

It is certified that error appears in the above-identified patent and that said Letters Patent is hereby corrected as shown below:

In the Specification

In the Cross-Reference to Related Applications:

In Column 1, Lines 12-13, change "patent application Ser. No." to --Patent Application No.--.

In Column 1, Line 17, change "patent application Ser. No." to --Patent Application No.--.

In Column 1, Lines 28-29, change "patent application Ser. No." to --Patent Application No.--.

Signed and Sealed this
Thirtieth Day of August, 2022

Katherine Kelly Vidal
*Director of the United States Patent and Trademark Office*